United States Patent
Takekida

(10) Patent No.: US 9,214,234 B2
(45) Date of Patent: Dec. 15, 2015

(54) NONVOLATILE SEMICONDUCTOR MEMORY DEVICE AND METHOD OF MANUFACTURING THE SAME

(71) Applicant: Kabushiki Kaisha Toshiba, Minato-ku (JP)

(72) Inventor: Hideto Takekida, Nagoya (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 65 days.

(21) Appl. No.: 14/150,155

(22) Filed: Jan. 8, 2014

(65) Prior Publication Data

US 2015/0063025 A1 Mar. 5, 2015

Related U.S. Application Data

(60) Provisional application No. 61/873,938, filed on Sep. 5, 2013.

(51) Int. Cl.

| | | |
|---|---|---|
| *H01L 29/788* | (2006.01) | |
| *G11C 16/04* | (2006.01) | |
| *G11C 16/12* | (2006.01) | |
| *H01L 27/115* | (2006.01) | |
| *H01L 29/66* | (2006.01) | |

(52) U.S. Cl.
CPC ............ *G11C 16/0433* (2013.01); *G11C 16/12* (2013.01); *H01L 27/11524* (2013.01); *H01L 27/11553* (2013.01); *H01L 29/66825* (2013.01)

(58) Field of Classification Search
CPC ............ H01L 27/11524; H01L 27/11553; H01L 29/66825; G11C 16/0433; G11C 16/12
USPC ............................. 257/314, 315, 320
See application file for complete search history.

(56) References Cited

U.S. PATENT DOCUMENTS

| | | |
|---|---|---|
| 7,679,960 B2 | 3/2010 | Hyun et al. |
| 7,705,388 B2 | 4/2010 | Iwata |
| 7,781,807 B2 | 8/2010 | Nishihara et al. |
| 2015/0044833 A1* | 2/2015 | Lee .................... G11C 16/3427 438/266 |

FOREIGN PATENT DOCUMENTS

| | | |
|---|---|---|
| JP | 2008-34456 | 2/2008 |
| JP | 2008-140912 | 6/2008 |
| JP | 2008-160113 | 7/2008 |

* cited by examiner

*Primary Examiner* — Long K Tran
(74) *Attorney, Agent, or Firm* — Oblon, McClelland, Maier & Neustadt, L.L.P.

(57) ABSTRACT

According to one embodiment, a memory cell string stacked body includes first memory cell transistors above a semiconductor substrate, and second memory cell transistors below a first channel semiconductor film, and one of the first memory cell transistors and one of the second memory cell transistors share with a control gate electrode. The control gate electrodes of the first memory cell transistors cover an upper surface of a first charge storage layer and at least a part of a side surface in a second direction via a first insulating film in the one of the first memory cell transistors. The control gate electrodes of the second memory cell transistors cover only a lower surface of a second charge storage layer via a second insulating film in one of the second memory cell transistors.

15 Claims, 31 Drawing Sheets

NONVOLATILE SEMICONDUCTOR MEMORY DEVICE AND METHOD OF MANUFACTURING THE SAME

CROSS-REFERENCE TO RELATED APPLICATIONS

This application is based upon and claims the benefit of priority from U.S. Provisional Application No. 61/873,938), filed on Sep. 5, 2013; the entire contents of which are incorporated herein by reference.

FIELD

Embodiments described herein relate generally to a nonvolatile semiconductor memory device and a method of manufacturing the same.

BACKGROUND

A shrinking of cells in NAND type flash memory is in progress for increase in a memory capacity per unit area. The shrinking in a planar cell structure is reaching its physical limitation due to degrade a breakdown voltage of insulating films and increase an interference effect between cells. As one strategy to overcome the limitation of the shrinking, a cell structure is not shrunk simply in a lateral direction but instead stacks the same in a vertical direction may be considered.

BRIEF DESCRIPTION OF THE DRAWINGS

FIG. 6A to FIG. 17A are perspective views schematically illustrating an example of procedures of a method of manufacturing the nonvolatile semiconductor memory device of the first embodiment;

FIG. 6B to FIG. 17B are an example of a cross sectional views in the direction vertical to the channel, of the memory cell transistors of FIG. 6A to 17A;

DETAILED DESCRIPTION

In general, according to one embodiment, a nonvolatile semiconductor memory device includes a first memory cell string stacked body including a first memory cell string having first memory cell transistors serially connected in a first direction above a semiconductor substrate, and a second memory cell string having second memory cell transistors serially connected in the first direction below a first channel semiconductor film, and one of the first memory cell transistors and one of the second memory cell transistors sharing with a first control gate electrode. The first control gate electrode is formed so as to cover an upper surface of a first charge storage layer (floating gate film) and at least a part of a side surface in a second direction intersecting the first direction via a first insulating film in the one of the first memory cell transistors. The first control gate electrode is formed so as to cover only a lower surface of a second charge storage layer (floating gate film) via a second insulating film in the one of the second memory cell transistors.

Hereinbelow, a nonvolatile semiconductor memory device and a method of manufacturing the same according to embodiments will be described in detail with reference to the attached drawings. Note that these embodiments do not limit the present invention.

First Embodiment

Figure 1:
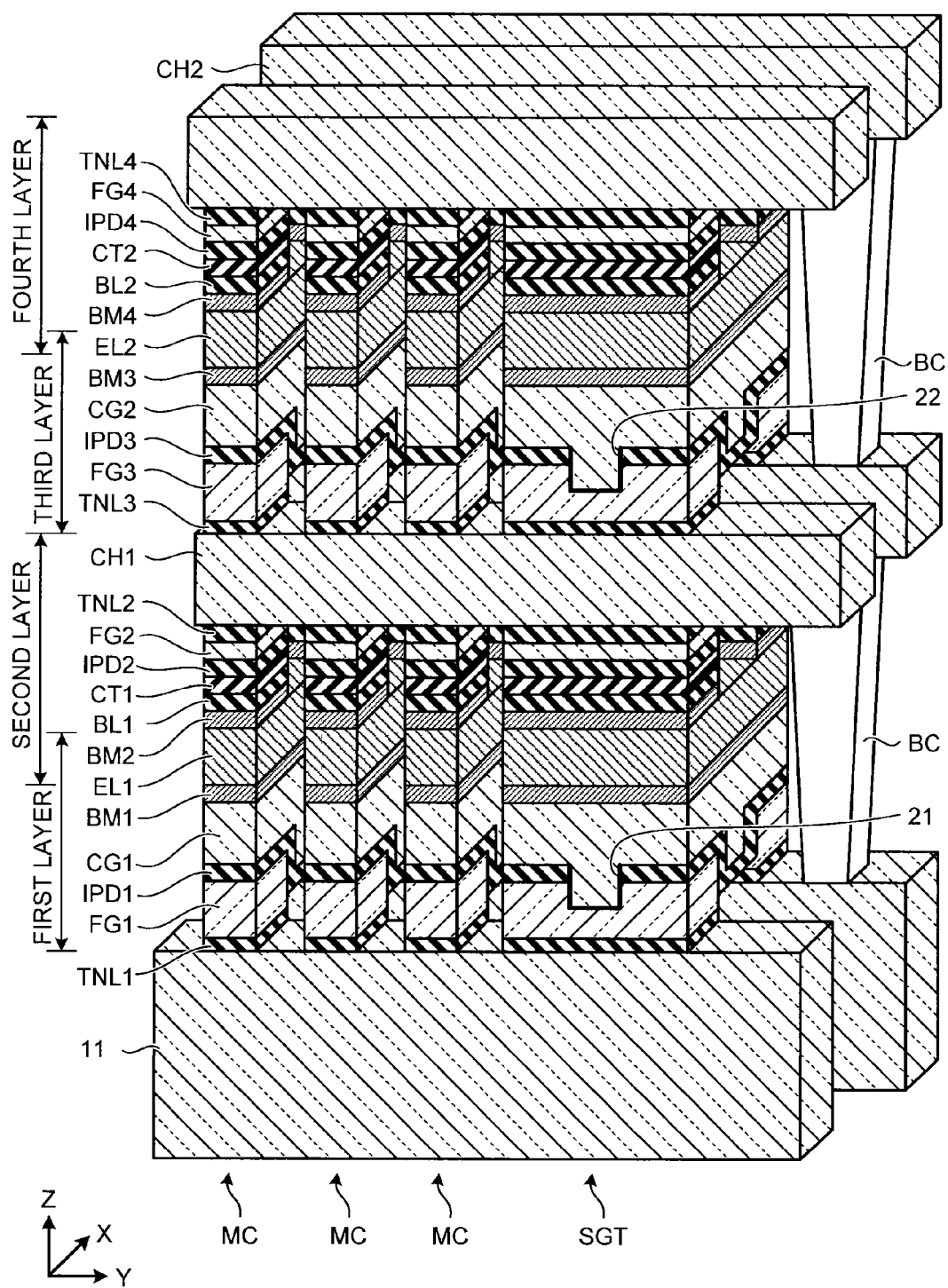
FIG. 1 is a perspective view schematically illustrating an example of a configuration of a nonvolatile semiconductor memory device of a first embodiment.
Figure 2:
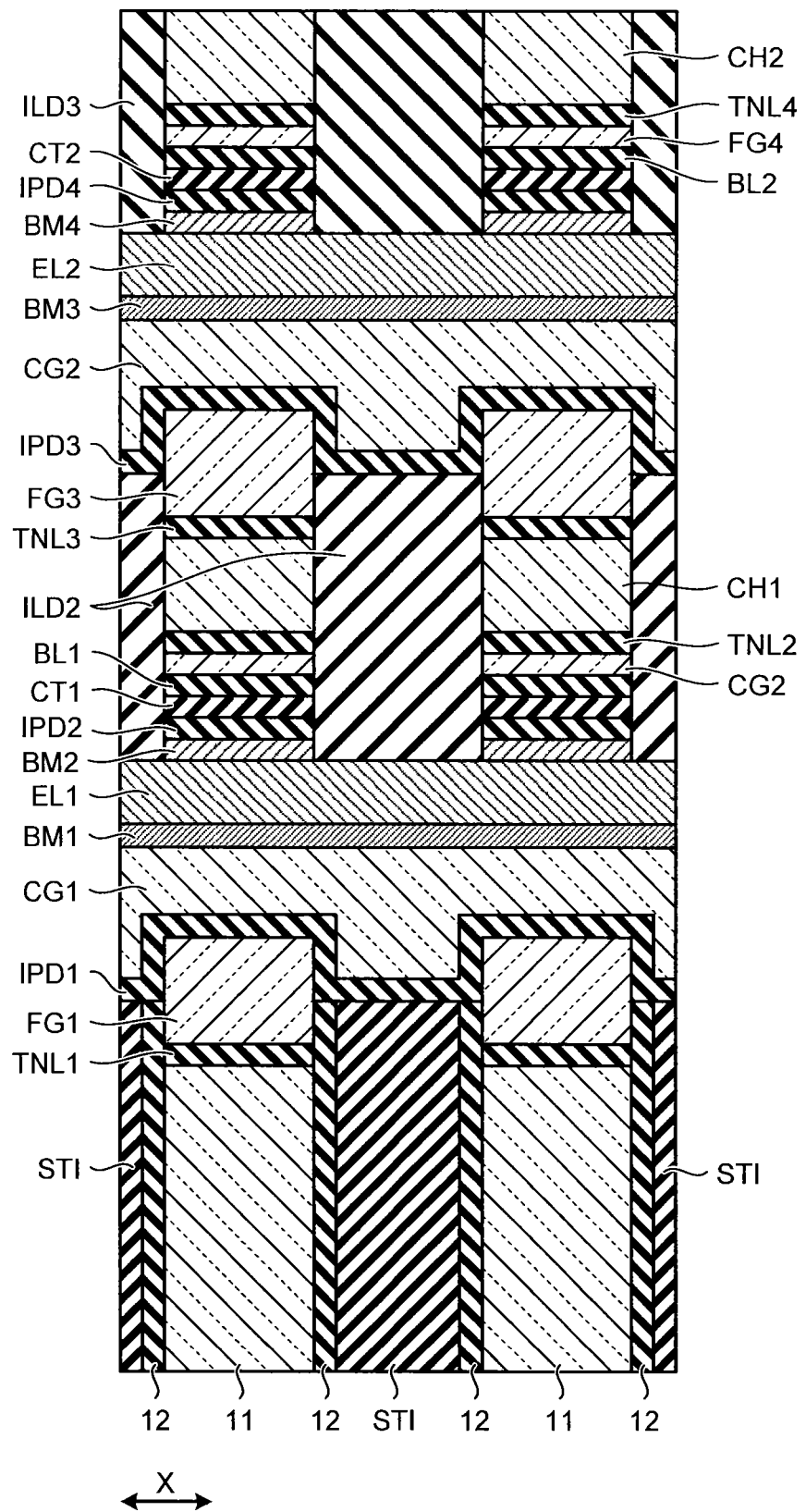
FIG. 2 is an example of a cross sectional view in a direction vertical to a channel, of memory cell transistors of the nonvolatile semiconductor memory device of FIG. 1.

FIG. 1 is a perspective view schematically illustrating an example of a configuration of a nonvolatile semiconductor memory device of the first embodiment, and FIG. 2 is a cross sectional view in a direction vertical to a channel, of memory cell transistors of the nonvolatile semiconductor memory device of FIG. 1. Notably, in FIG. 1, interlayer insulating films are omitted from the drawings. Further, in FIG. 1 and in similar perspective views herein, hatching is given to portions other than cross sectional portions for easier recognition of respective layers. Further, in FIG. 1, a channel direction (bit line direction) is set as a Y direction, a height direction is set as a Z direction, and a direction vertical to both the Y direction and the Z direction is set as an X direction.

The nonvolatile semiconductor memory device has a structure in which memory cell strings are stacked in plural layers in the Z direction above a semiconductor substrate 11 such as a single-crystalline silicon substrate, where each memory cell string has memory cell transistors MC serially connected in the Y direction between a pair of select gate transistors SGT (in the drawing, only one of the select gate transistors SGT is depicted). Specifically, a structure in which the memory cell string stacked body in which a first layer of memory cell string and a second layer of memory cell string that is arranged in a manner that shares a word line (select gate line) with the first layer of memory cell string are stacked are stacked in the Z direction above the semiconductor substrate 11 is employed. Here, each memory cell string stacked body is stacked so as to share a channel (bit line).

In a cross section vertical to the Y direction of the memory cell transistors MC (select gate transistor SGT) configuring the memory cell strings on a lower layer side in the memory cell string stacked body, a cell structure in which a control gate electrode film intervenes between the memory cell transistors MC (select gate transistors SGT) that are adjacent in the X direction via an inter-electrode insulating film (hereinafter referred to as a rocket cell structure) is employed. On the other hand, the memory cell transistors MC (select gate transistors SGT) configuring the memory cell strings on an upper layer side have a planar type cell structure (hereinafter referred to as planar cell structure).

In FIG. 1 and FIG. 2, a case in which two layers of the memory cell string stacked bodies (four layers of memory cell strings) are stacked is illustrated, however, a structure in which three or more layers of the memory cell string stacked bodies are stacked may be employed.

Next, a specific structure will be described. The memory cell transistors MC of the memory cell string of the first layer include a stacked gate structure in which a tunnel insulating film TNL1, a floating gate electrode film FG1, an inter-electrode insulating film IPD1, a control gate electrode film CG1, a barrier metal film BM1, and a metal electrode film EL1 are orderly stacked above the semiconductor substrate 11 that is to be the channel, and a source/drain regions (not illustrated) formed on the surface of the semiconductor substrate 11 of the both sides in the stacked gate structures in an extending direction of the memory cell strings. The control gate electrode film CG1 to the metal electrode film EL1 function as a control gate electrode in a broad sense. Further, the barrier metal film BM1 can be provided to increase a adhesion between the control gate electrode film CG1 and the metal electrode film EL1.

The channels (surface of the semiconductor substrate 11) of the memory cell transistors MC, the tunnel insulating film TNL1, and the floating gate electrode film FG1 are isolated by element isolation insulating films STI formed at a predetermined interval in the X direction. Liner films 12 may be provided between the channel (surface of the semiconductor substrate 11), the tunnel insulating film TNL1 and the floating gate electrode film FG1, and the element isolation insulating film STI.

Further, there is a structure in which the inter-electrode insulating film IPD1, the control gate electrode film CG1, the barrier metal film BM1, and the metal electrode film EL1 are continuously formed above the element isolation insulating film STI and existing in the X direction so as to be shared by the memory cell transistors MC adjacent to the X direction. Notably, a position of an upper surface of the element isolation insulating film STI is provided to be positioned between an upper surface of the tunnel insulating film TNL1 and an upper surface of the floating gate electrode film FG1. Due to this, the rocket cell structure in which the control gate electrode film CG1 goes around to a side surface of the floating gate electrode film FG1 in the X direction is employed, whereby a voltage applied to the control gate electrode film CG1 can efficiently be transmitted to the floating gate electrode film FG1. Further, the upper surface of the control gate electrode film CG1 is made flat so as to be substantially parallel to a surface of the semiconductor substrate 11. Moreover, in the memory cell string, the stacked gate structures that are adjacent in the Y direction are separated for example by an interlayer insulating film.

Notably, the select gate transistors SGT configuring the memory cell string of the first layer basically have similar structure as the memory cell transistors MC. However, the select gate transistors SGT each have a structure in which an opening 21 is provided at a part of the inter-electrode insulating film IPD1, and the control gate electrode film CG1 contacts with the floating gate electrode film FG1 that is a lower layer of the inter-electrode insulating film IPD1 via the opening 21, then it is possible to connect the control gate electrode film CG1 to the floating gate electrode film FG1. According to this, the control gate electrode film CG1 and the floating gate electrode film FG1 configure a gate electrode. Further, one of the source/drain regions of the select gate transistor SGT is shared with the source/drain regions of the adjacent memory cell transistor MC.

The memory cell transistors MC of the memory cell string of the second layer have stacked gate structures in each of which a metal electrode film EL1, a barrier metal film BM2, a block insulating film BL1, a charge trapping film CT1, an inter-electrode insulating film IPD2, a floating gate electrode film FG2, and a tunnel insulating film TNL2 are orderly stacked on the memory cell transistors MC of the memory cell string of the first layer, a channel semiconductor film CH1 that becomes a channel, and source/drain regions (not illustrated) formed in the channel semiconductor layer CH1 of the both sides in the stacked gate structures in the Y direction. Notably, the floating gate electrode film FG2 to the charge trapping film CT1 function as a charge accumulation layer in a broad sense, and the barrier metal film BM2 and the metal electrode film EL1 have a function as a control gate electrode in a broad sense. Further, the barrier metal film BM2 can be provided to prevent elements in between the metal electrode film EL1 and the inter-electrode insulating film IPD2 from diffusing.

As illustrated in FIG. 1 and FIG. 2, the respective films configuring the stacked gate structures are stacked so as to be substantially parallel to the surface of the semiconductor substrate 11, and an interlayer insulating film ILD2 is arranged is provided between the stacked gate structures that are adjacent in the X direction.

The channel semiconductor films CH1 extend in the Y direction, and are arranged in a line-and-space shape at a predetermined interval in the X direction. The interlayer insulating film ILD2 that serves as an element isolation insulating film is embedded between the channel semiconductor films CH1 that are adjacent in the X direction.

Notably, the select gate transistors SGT configuring the memory cell string of the second layer basically have similar structure as the memory cell transistors MC. Due to this, the select gate transistor SGT configuring the memory cell string of the second layer have the charge accumulation layer is sandwiched between the control gate electrode EL1 and the channel semiconductor film CH1, similar to the memory cell transistors MC of the second layer. As will be described later, an accumulated charge amount in the charge accumulation layer of the select gate transistor SGT of the second layer is adjusted such that a threshold voltage of the select gate transistor SGT of an upper layer differs form that of a lower layer. Further, one of the source/drain regions of the select gate transistor SGT is shared with the source/drain regions of the adjacent memory cell transistor MC.

The memory cell transistors MC of the memory cell string of the third layer each include a stacked gate structure in which a tunnel insulating film TNL3, a floating gate electrode film FG3, an inter-electrode insulating film IPD3, a control gate electrode film CG2, a barrier metal film BM3, and a metal electrode film EL2 are orderly stacked on the channel semiconductor film CH1, and a source/drain regions (not illustrated) formed on the surface of the channel semiconductor film CH1 of the both sides in the stacked gate structures in the Y direction. The control gate electrode film CG2 to the metal electrode film EL2 function as a control gate electrode in a broad sense. Further, the barrier metal film BM3 can be provided to increase a tight contact between the control gate electrode film CG2 and the metal electrode film EL2.

The inter-electrode insulating film IPD3, the control gate electrode film CG2, the barrier metal film BM3, and the metal electrode film EL2 are in a structure that is extending in the X direction and continuously formed above the interlayer insulating film ILD2 as an element isolation insulating film so as to be shared by the memory cell transistors MC adjacent to the X direction. Notably, a position of an upper surface of the interlayer insulating film ILD2 is provided to be positioned between an upper surface of the tunnel insulating film TNL3 and an upper surface of the floating gate electrode film FG3. Due to this, the rocket cell structure in which the control gate electrode film CG2 goes around to a side surface of the floating gate electrode film FG3 in the X direction is employed, whereby a voltage applied to the control gate electrode film CG2 can efficiently be transmitted to the floating gate electrode film FG3. Further, in the memory cell string, the stacked gate structures that are adjacent in the Y direction are separated for example by an interlayer insulating film.

Notably, the select gate transistors SGT configuring the memory cell string of the third layer basically have similar structure as the memory cell transistors MC. However, the select gate transistors SGT each have a structure in which an opening 22 is provided at a part of the inter-electrode insulating film IPD3, and the control gate electrode film CG2 contacts with the floating gate electrode film FG3 that is disposed under the inter-electrode insulating film IPD3 via the opening 22, then it is possible to connect the control gate electrode film CG2 to the floating gate electrode film FG3. According to this, the control gate electrode film CG2 and the floating gate electrode film FG3 configure a gate electrode. Further, one of the source/drain regions of the select gate transistor SGT is shared with the source/drain regions of the adjacent memory cell transistor MC.

The memory cell transistors MC of the memory cell string of the fourth layer have stacked gate structures in each of which a metal electrode film EL2, a barrier metal film BM4, a block insulating film BL2, a charge trapping film CT3, an inter-electrode insulating film IPD4, a floating gate electrode film FG4, and a tunnel insulating film TNL4 are orderly stacked on the memory cell transistors MC of the memory cell string of the third layer, a channel semiconductor film CH2 that becomes a channel and source/drain regions (not illustrated) formed in the channel semiconductor layer CH2 of the both sides in the stacked gate structures in the Y direction. Notably, the floating gate electrode film FG4 to the charge trapping film CT2 function as a charge accumulation layer in a broad sense, and the barrier metal film BM4 and the metal electrode film E2 have a function as a control gate electrode in a broad sense. Further, the barrier metal film BM4 can be provided to prevent elements in between the metal electrode film EL2 and the inter-electrode insulating film IPD4 from diffusing.

As illustrated in FIG. 1 and FIG. 2, the respective films configuring the stacked gate structures are stacked so as to be substantially parallel to the surface of the semiconductor substrate 11, and an interlayer insulating film ILD3 is arranged is provided between the stacked gate structures that are adjacent in the X direction.

The channel semiconductor films CH2 extend in the Y direction, and are arranged in a line-and-space shape at a predetermined interval in the X direction. Further, forming positions of the channel semiconductor films CH2 in an XY plane is substantially equal to forming positions of the channel semiconductor films CH1 in the XY plane. The interlayer insulating film ILD3 that serves as an element isolation insulating film is embedded between the channel semiconductor films CH2 that are adjacent in the X direction.

Notably, the select gate transistors SGT configuring the memory cell string of the fourth layer basically have similar structure as the memory cell transistors MC. Due to this, the select gate transistor SGT configuring the memory cell string of the fourth layer have the charge accumulation layer is sandwiched between the control gate electrode EL2 and the channel semiconductor film CH2, similar to the memory cell transistors MC of the fourth layer. Further, one of the source/drain regions of the select gate transistor SGT is shared with the source/drain regions of the adjacent memory cell transistor MC.

Further, a bit line contact BC is provided on one of the source/drain regions of select gate transistors, and the one of the source/drain regions is not shared with the source/drain regions of the memory cell transistor MC adjacent to the select gate transistor SGT. And the bit line contact BC is provided on one select gate transistor SGT among the pair of select gate transistors SGT configuring each memory cell string. Notably, in the drawings, only a part of the bit line contacts BC is illustrated for easier explanation.

Here, materials and thicknesses of the respective layers configuring the memory cell strings in the respective memory cell string stacked bodies will be exemplified. As the tunnel insulating films TNL1, TNL3, for example, silicon oxide films with the thickness of 6 to 12 nm and the like may be used. As the floating gate electrode films FG1, FG3, for example, polycrystalline silicon films with the thickness of 40 to 100 nm and the like may be used. As the inter-electrode insulating films IPD1, IPD3, for example, silicon oxide films with the thickness of 7 to 12 nm and the like may be used. As the control gate electrode films CG1, CG2, for example, polycrystalline silicon films of a predetermined conductivity type with the thickness of 10 to 30 nm may be used.

As the barrier metal films BM1, BM2, BM3, BM4, for example, tungsten nitride (WN) with the thickness of 5 to 10 nm and the like may be used, and as the metal electrode films EL1, EL2, for example, tungsten (W) with the thickness of 40 to 60 nm and the like may be used.

As the block insulating films BL1, BL2, for example, HfSiO$_x$ films, TaO$_x$ films, AlO films with the thickness of 5 to 10 nm, or SiO$_2$ films with the thickness of 4 to 7 nm and the like may be used. As the charge trapping films CT1, CT2, HfSiO$_x$ films or SiON films with the thickness of 4 to 7 nm and the like may be used. As the inter-electrode insulating films IPD2, IPD4, for example, SiN films with the thickness of 2 to 5 nm and the like may be used. As the floating gate electrode films FG2, FG4, for example, polycrystalline silicon films with the thickness of 3 to 8 nm and the like may be used. As the tunnel insulating films TNL2, TNL4, for example, silicon oxide films with the thickness of 4 to 7 nm and the like may be used.

Next, an operation of the nonvolatile semiconductor memory device with the above configuration will be described. As illustrated in FIG. 1 and FIG. 2, in one memory cell string stacked body, the select gate line (the metal electrode film EL1, EL2) is shared between the memory cell string of the lower layer and the memory cell string of the upper layer. Due to this, in a case where a threshold voltage of the select gate transistor SGT of the lower layer and the select gate transistor SGT of the upper layer is the same and a voltage is applied to the select gate line, the memory cell strings on the upper layer and the lower layer are unexpectedly selected.

Figure 3:
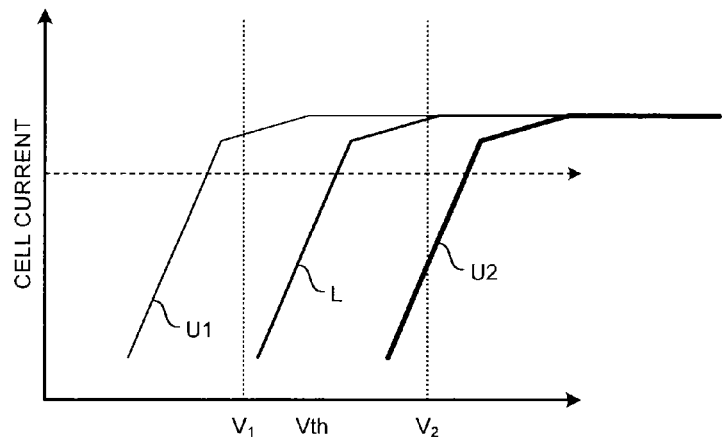
FIG. 3 is an example of a diagram schematically illustrating a relationship of threshold voltage and current in a select gate transistor in a memory cell string stacked body of the first embodiment.

Incidentally, in the select gate transistor SGT of the upper layer, the charge trapping film and the control gate electrode are not electrically connected, similar to the memory cell transistors MC of the second layer, and it is possible to adjust the threshold voltage by accumulating charges in the charge trapping films CT1, CT2. FIG. 3 is a diagram schematically illustrating a relationship of the threshold voltage and current in the select gate transistor in the memory cell string stacked body of the first embodiment. In this drawing, a horizontal axis is the threshold voltage of the select gate transistor SGT, and a vertical axis is the current that flows in the select gate transistor.

A curve line L is a curve line illustrating a property of the select gate transistor SGT of the lower layer. Further, a curve line U1 shows a property in a state where the charges of the charge trapping films CT1, CT2 are discharged in the select gate transistor SGT of the upper layer, and a curve line U2 shows a property in a state where the charges of the charge trapping films CT1, CT2 are injected in the select gate transistor SGT of the upper layer. In the select gate transistor SGT of the lower layer of the rocket cell structure, since the floating gate electrode films FG1, FG3 are electrically connected to the control gate electrode films CG1, CG2 via the openings 21, 22, their properties are substantially stable. Further, the threshold voltage of the select gate transistor SGT of the lower layer is $V_2$.

In supposing that the select gate transistor SGT of the upper layer has the same property as the curve line L in an initial state, when the select gate transistor SGT of the lower layer turns off and the select gate transistor SGT of the upper layer turns on, for example, the accumulated charge amount at the charge trapping films CT1, CT2 of the select gate transistor SGT of the upper layer may be adjusted so that the threshold voltage becomes $V_1$ ($<V_2$). In this case, a current-voltage curve line of the select gate transistor SGT of the lower layer shifts to a leftward direction compared to the curve line L similar to the curve line U1 by discharging the charges in the charge trapping films CT1, CT2. Further, when a voltage value $V_1$ is applied to the select gate line, since the voltage value $V_1$ is lower than the threshold voltage $V_2$, the select gate transistor SGT of the lower layer does not turn on, and only the select gate transistor SGT of the upper layer turns on.

On the other hand, when the select gate transistor SGT of the lower layer turns on and the select gate transistor SGT of the upper layer turns off, for example, the accumulated charge amount at the charge trapping films CT1, CT2 of the select gate transistor SGT of the upper layer may be adjusted so that a threshold voltage of the select gate transistor SGT of the upper layer becomes higher than $V_2$. In this case, the current-voltage curve line of the select gate transistor SGT of the lower layer shifts to a rightward direction compared to the curve line L similar to the curve line U2 by injecting the charges in the charge trapping films CT1, CT2. Further, when a voltage value $V_2$ is applied to the select gate line, since the current flows in the select gate transistor SGT of the lower layer but the current does not flow in the select gate transistor SGT of the upper layer, the select gate transistor SGT of the upper layer does not turn on, and only the select gate transistor SGT of the lower layer turns on.

Notably, this process can be performed by comparing the threshold voltages of the select gate transistors SGT of the upper layer and the lower layer.

Figure 4:
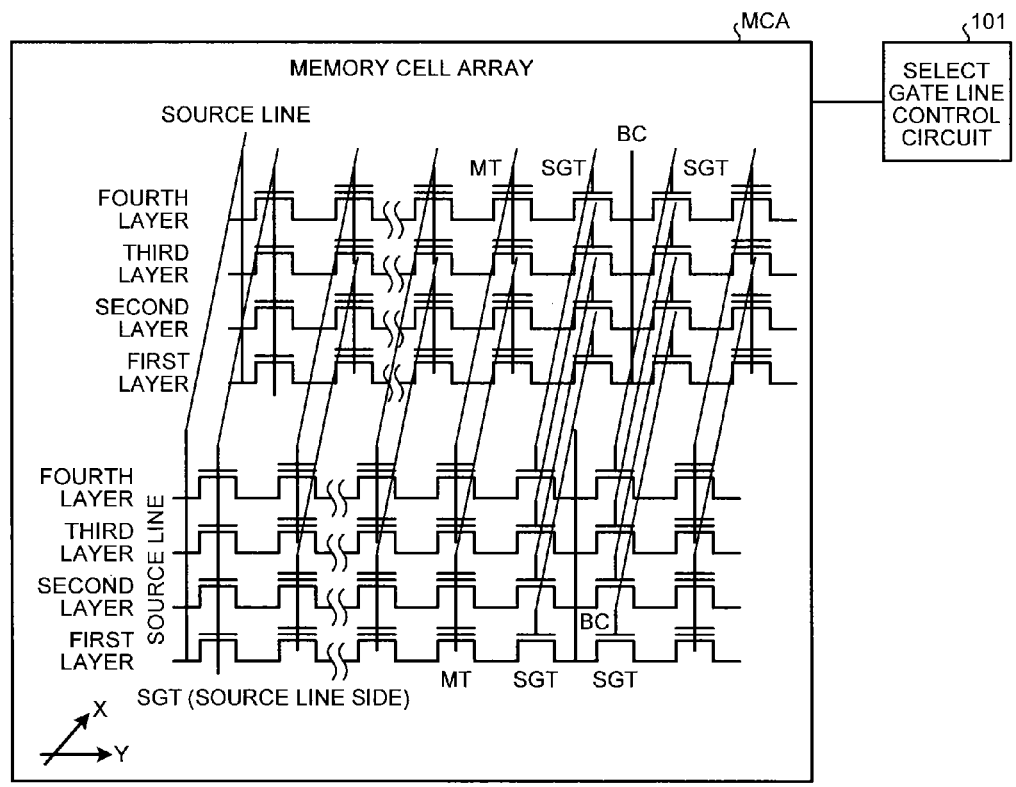
FIG. 4 is a block diagram schematically illustrating an example of the configuration of the nonvolatile semiconductor memory device of the first embodiment.
Figure 5:
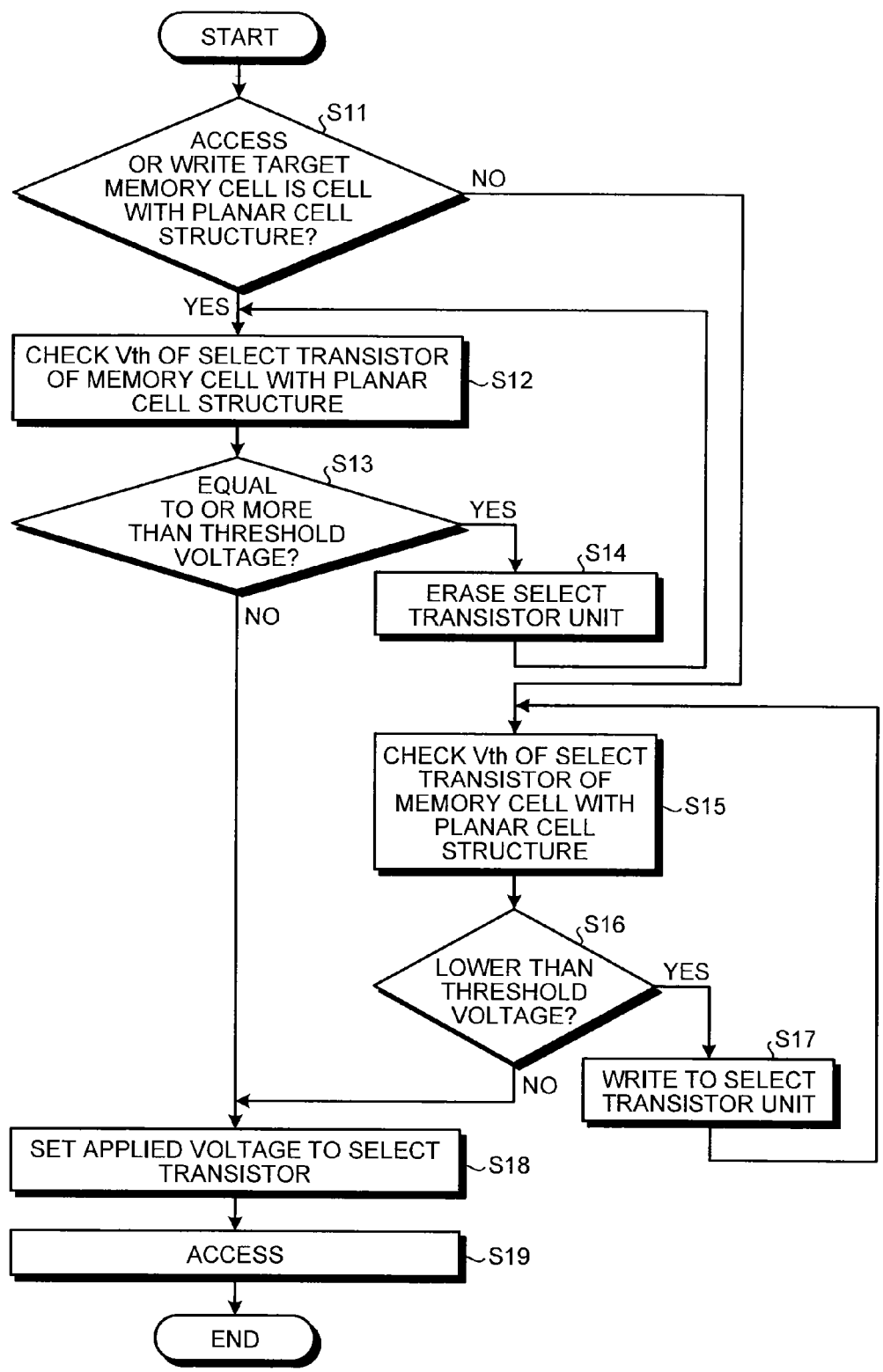
FIG. 5 is a flowchart illustrating an example of a selection procedure of the select gate transistor in the nonvolatile semiconductor memory device of the first embodiment.

FIG. 4 is a block diagram schematically illustrating an example of the configuration of the nonvolatile semiconductor memory device of the first embodiment, and FIG. 5 is a flowchart illustrating an example of a selection procedure of the select gate transistor in the nonvolatile semiconductor memory device of the first embodiment.

As illustrated in FIG. 4, the nonvolatile semiconductor memory device includes a memory cell array MCA in which the memory cell strings described above are arranged in a matrix shape on the semiconductor substrate, and a select gate line control circuit 101 that performs control of the threshold voltages of the select gate transistors SGT in the memory cell strings in the memory cell array MCA. The select gate line control circuit 101 performs the process illustrated in FIG. 5.

Firstly, the select gate line control circuit 101 determines whether a memory cell that is an access target or a write target is a memory cell with the planar cell structure or not (step S11). If the memory cell that is the access target or the write target is the memory cell with the planar cell structure (Yes in step S11), a value of the threshold voltage Vth of the select gate transistor SGT of the memory cell with the planar cell structure is investigated (step S12). Next, a determination is made on whether a value of the threshold voltage Vth of the select gate transistor SGT (of the upper layer) of the memory cell with the planar cell structure is equal to or more than the threshold voltage of the select gate transistor SGT (of the lower layer) in the rocket structure or not (step S13).

If the value of the threshold voltage Vth of the select gate transistor SGT (of the upper layer) of the memory cell with the planar cell structure is equal to or more than the threshold voltage of the select gate transistor SGT (of the lower layer) in the rocket structure (Yes in step S13), the select gate line control circuit 101 performs an erasing operation to the select gate transistor SGT (of the upper layer) of the planar cell structure (step S14), and the procedure returns to step S12. This operation is performed until the value of the threshold voltage Vth of the select gate transistor SGT (of the upper layer) of the memory cell with the planar cell structure becomes lower than the threshold voltage of the select gate transistor SGT (of the lower layer) in the rocket structure.

If the value of the threshold voltage Vth of the select gate transistor SGT (of the upper layer) of the memory cell with the planar cell structure is lower than the threshold voltage of the select gate transistor SGT (of the lower layer) in the rocket structure (No in step S13), the select gate line control circuit 101 sets a voltage to be applied to the select gate transistor SGT (step S18), and performs accessing to the memory cell that is the access target or the write target (step S19). According to the above, the procedure is completed.

For example, in a case of increasing the threshold voltage Vth of the select gate transistor SGT in the planar cell structure, the select gate line control circuit 101 applies a high voltage to the control gate electrode and applies 0 V to the channel semiconductor film CH. At this occasion, the select gate line control circuit 101 can set the voltage by which hardly damage is applied to a gate insulating film (tunnel insulating film) of the select gate transistor SGT in the rocket structure. Further, the select gate line control circuit 101 controls the control gate of the memory cell to be in a floating state so as not to shift the threshold voltage of the memory cell.

For example, in a case reducing the threshold voltage Vth of the select gate transistor SGT in the planar cell structure, the select gate line control circuit 101 applies 0 V to the control gate electrode and applies a high voltage to the channel semiconductor film CH. At this occasion, the select gate line control circuit 101 can set the voltage by which hardly damage is applied to a gate insulating film (tunnel insulating film) of the select gate transistor SGT in the rocket structure. Further, the select gate line control circuit 101 controls the control gate of the memory cell to be in a floating state so as not to shift the threshold voltage of the memory cell.

Further, in the select gate transistor SGT in the planar cell structure in which the threshold voltage Vth is maintained, the channel semiconductor film CH may be caused to be floating. Moreover, in a case of changing the threshold voltage Vth of the select gate transistor SGT in the planar cell structure of the memory cell string stacked body of the lower layer, the select gate line control circuit 101 may control all of the control gate electrodes of the memory cell string stacked body of the upper layer to be in the floating state.

On the other hand, in a case where the memory cell that is the access target or the write target is not a memory cell with the planar cell structure in step S11, that is, in the case of being a memory cell with the rocket cell structure (No in step S11), the select gate line control circuit 101 checks the value of the threshold voltage Vth of the select gate transistor SGT of the memory cell with the planar cell structure (step S15). Next, a determination is made on whether the value of the threshold voltage Vth of the select gate transistor SGT (of the upper layer) of the memory cell with the planar cell structure is lower than the threshold voltage of the select gate transistor SGT (of the lower layer) in the rocket structure or not (step S16).

If the value of the threshold voltage Vth of the select gate transistor SGT (of the upper layer) of the memory cell with the planar cell structure is lower than the threshold voltage of the select gate transistor SGT (of the lower layer) of the memory cell in the rocket structure (Yes in step S16), a write operation is performed to the select gate transistor SGT (of the upper layer) in the planar cell structure (step S17), and the procedure returns to step S15. This operation is performed until when the value of the threshold voltage Vth of the select gate transistor SGT (of the upper layer) of the memory cell with the planar cell structure becomes higher than the threshold voltage of the select gate transistor SGT (of the lower layer) in the rocket structure.

If the value of the threshold voltage Vth of the select gate transistor SGT (of the upper layer) of the memory cell with the planar cell structure is higher than the threshold voltage of the select gate transistor SGT (of the lower layer) in the rocket structure (No in step S16), the select gate line control circuit 101 sets a voltage to be applied to the select gate transistor SGT (step S18), and performs accessing to the memory cell that is the access target or the write target (step S19). According to the above, the procedure is completed.

Here, the adjustment of the threshold voltage Vth of the select gate transistor SGT in the planar cell structure can be performed as aforementioned.

Next, a method of manufacturing the nonvolatile semiconductor memory device illustrated in FIG. 1 and FIG. 2 will be described. FIG. 6A to FIG. 17B are diagrams schematically illustrating an example of the procedure of the method of manufacturing the nonvolatile semiconductor memory device of the first embodiment, where FIG. 6A to FIG. 17A are perspective views schematically illustrating the example of the procedure of the method of manufacturing the nonvolatile semiconductor memory device of the first embodiment, and FIG. 6B to FIG. 17B are cross sectional views in a direction vertical to the channels in the memory cell transistors of FIG. 6A to 17A.

Figure 6A:
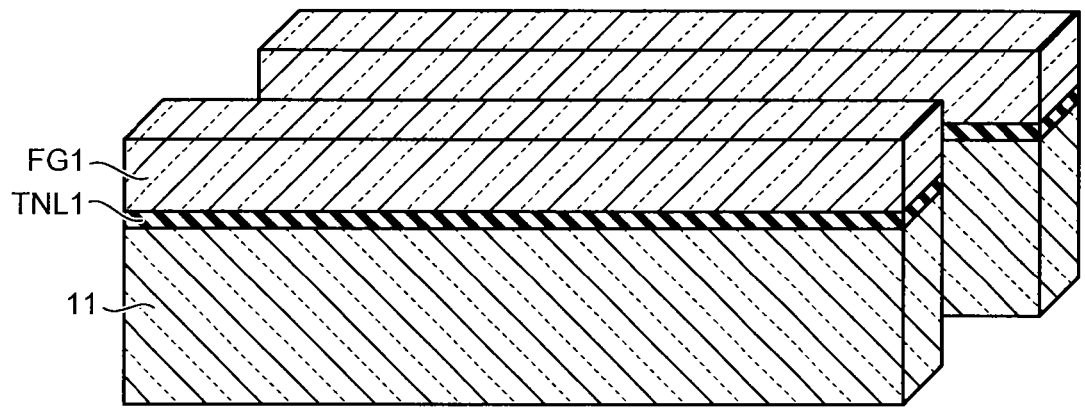
Figure 6A:
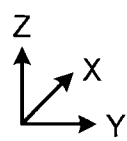
Figure 6B:
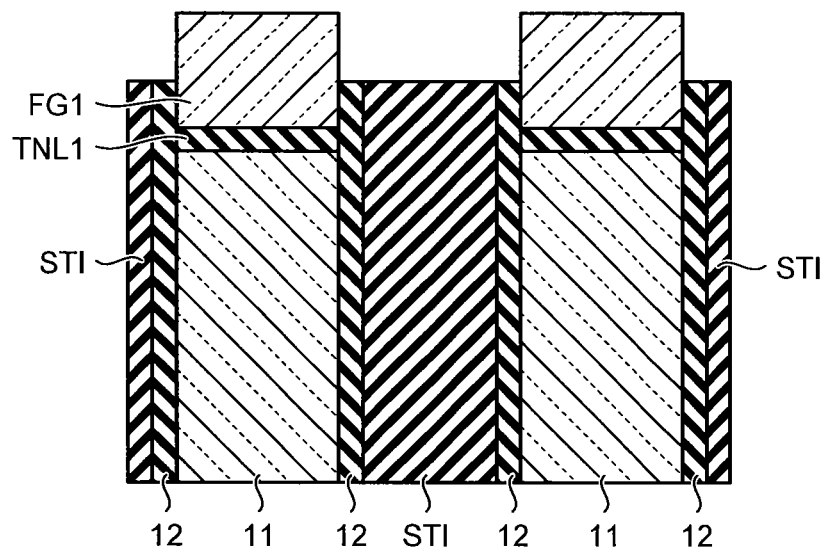
Figure 6B:
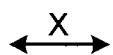

Firstly, as illustrated in FIG. 6A and FIG. 6B, the tunnel insulating film TNL1 and the floating gate electrode film FG1 are orderly stacked above the semiconductor substrate 11 such as a single-crystalline silicon substrate. As the tunnel insulating film TNL1, for example, a silicon oxide film with the thickness of 8 nm may be used, and as the floating gate electrode film FG1, for example, a polycrystalline silicon film with the thickness of 60 nm may be used.

Next, by using a lithography technique and an etching technique, trenches for element isolation insulating film formation that reach a predetermined depth of the semiconductor substrate 11 from the floating gate electrode films FG1 and extend in the Y direction are formed at a predetermined interval in the X direction. Thereafter, liner films 12 are formed in the trenches for element isolation insulating film formation. Then, insulating films such as silicon oxide films are embedded in the trenches for element isolation insulating film formation in which the liner films 12 are formed, and the element isolation insulating films STI are formed. Further, the upper surfaces of the element isolation insulating films STI and the liner films 12 are formed to be higher than the upper surfaces of the tunnel insulating films TNL1 but lower than the upper surfaces of the floating gate electrode films FG1.

Figure 7A:
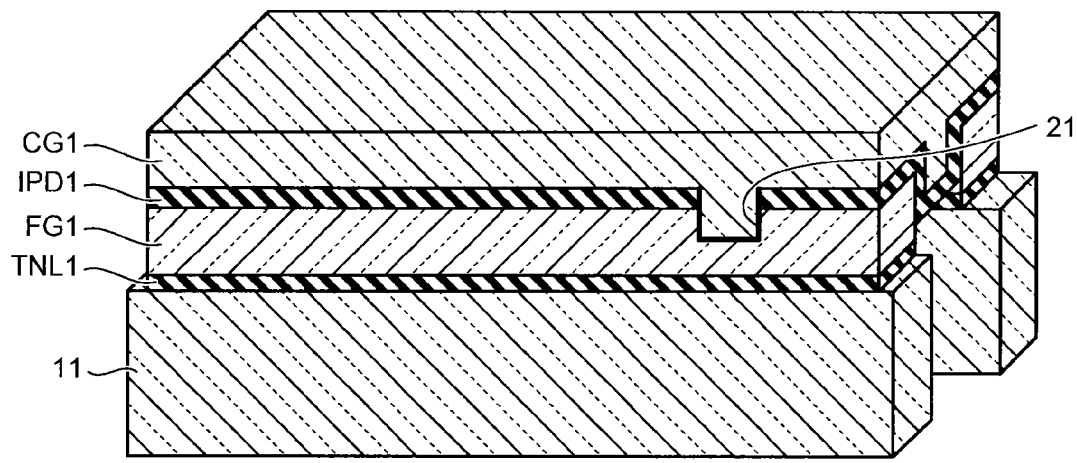
Figure 7B:
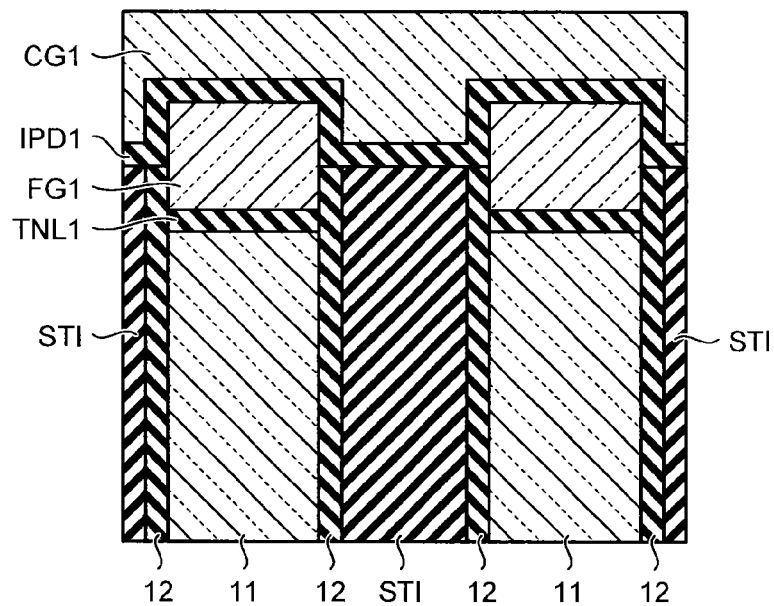

Next, as illustrated in FIG. 7A and FIG. 7B, the inter-electrode insulating film IPD1 is formed above an entire surface of the semiconductor substrate 11. At this occasion, the inter-electrode insulating film IPD1 is formed so that the upper surfaces of the element isolation insulating film STI, side surfaces and the upper surfaces of the floating gate electrode films FG1, and are covered conformally in the X direction. As the inter-electrode insulating film IPD1, for example, a silicon oxide film with the thickness of 10 nm and the like may be used.

Thereafter, a part of the inter-electrode insulating film IPD1 at a select gate transistor forming position is removed, and the opening 21 penetrating in the thickness direction of the inter-electrode insulating film IPD1 is provided. Then, the control gate electrode film CG1 is formed above the entire surface of the semiconductor substrate 11. As the control gate electrode film CG1, for example, a polycrystalline silicon film with the thickness of 20 nm may be used. According to this, at the select gate transistor forming position, the control gate electrode film CG1 makes contact with the floating gate electrode films FG1 through the opening 21.

Figure 8A:
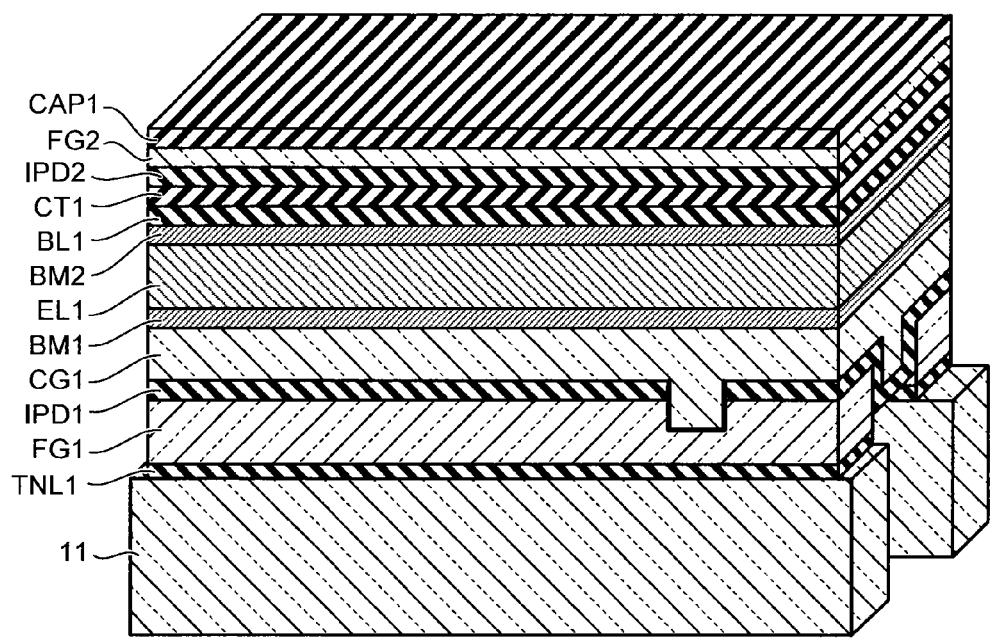
Figure 8B:
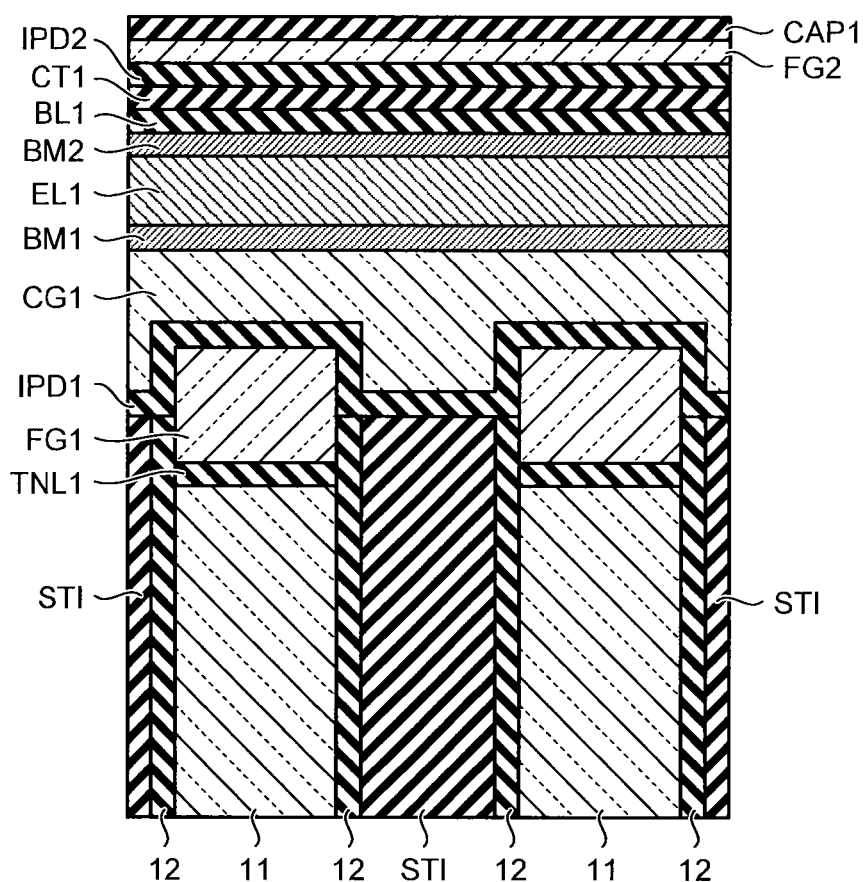

Next, as illustrated in FIG. 8A and FIG. 8B, the barrier metal film BM1, the metal electrode film EL1, the barrier metal film BM2, the block insulating film BL1, the charge trapping film CT1, the inter-electrode insulating film IPD2, the floating gate electrode film FG2, and a cap film CAP1 are orderly stacked above the semiconductor substrate 11.

As the barrier metal films BM1, BM2, for example, tungsten nitride (WN) with the thickness of 5 nm and the like may be used, and as the metal electrode film EL1, for example, tungsten (W) with the thickness of 50 nm and the like may be used. Further, as the block insulating film BL1, for example, a $HfSiO_x$ film with the thickness of 7 nm and the like may be used, and as the charge trapping film CT1, a $HfSiO_x$ film with the thickness of 5 nm and the like may be used. As the inter-electrode insulating film IPD2, for example, a SiN film with the thickness of 3 nm and the like may be used, and as the floating gate electrode film FG2, for example, a polycrystalline silicon film with the thickness of 5 nm and the like may be used. Further, as the cap film CAP1, a SiN film with the thickness of 10 to 30 nm and the like may be used.

Figure 9A:
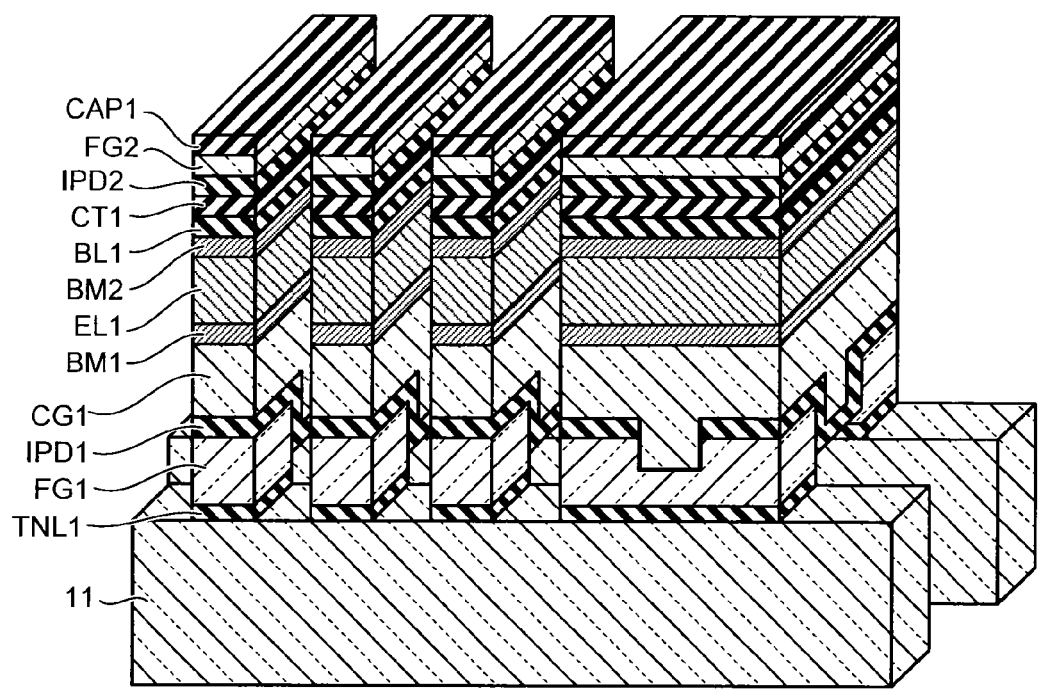
Figure 9B:
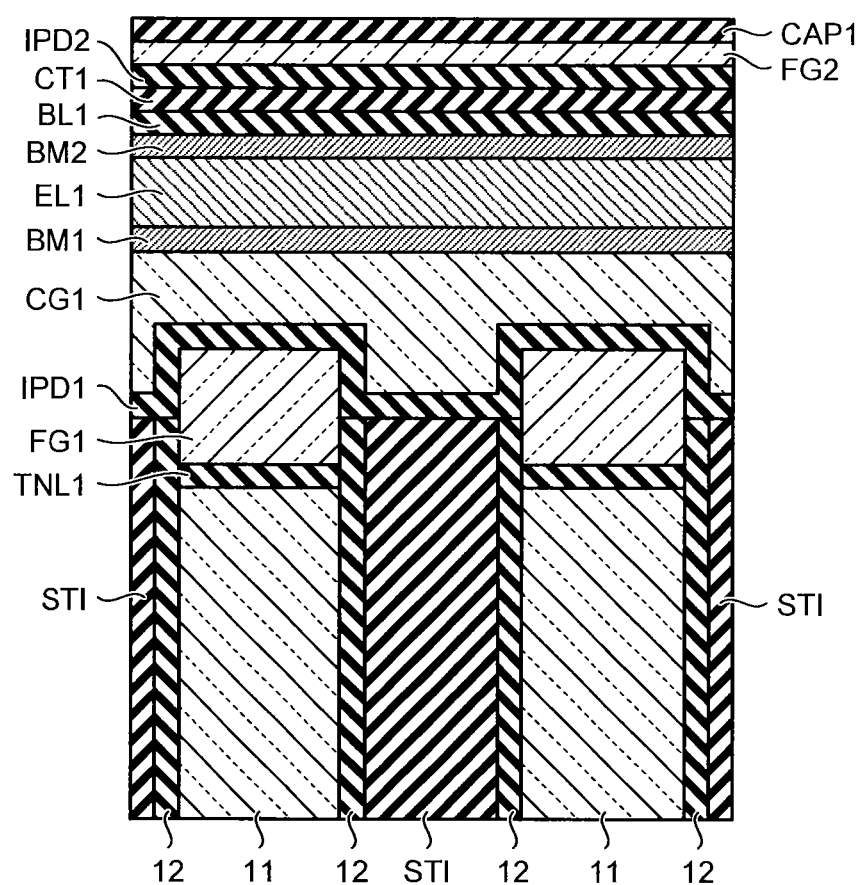

Thereafter, as illustrated in FIG. 9A and FIG. 9B, by using the lithography technique and the etching technique, in a memory cell transistor forming region, the cap film CAP1 to the tunnel insulating film TNL1 are processed in the line and space-shaped pattern that is extending in the X direction and arranged at a predetermined interval in the Y direction. And, in select gate transistor forming regions on both sides of the memory cell transistor forming region in the Y direction, a line pattern of the select gate transistor is thicker than a width of the memory cell transistor. According to this, the control gate electrodes (control gate electrode film CG1, barrier metal film BM1, metal electrode film EL1, barrier metal film BM2) of the memory cell strings of the first layer and the second layer are concurrently processed.

Figure 10A:
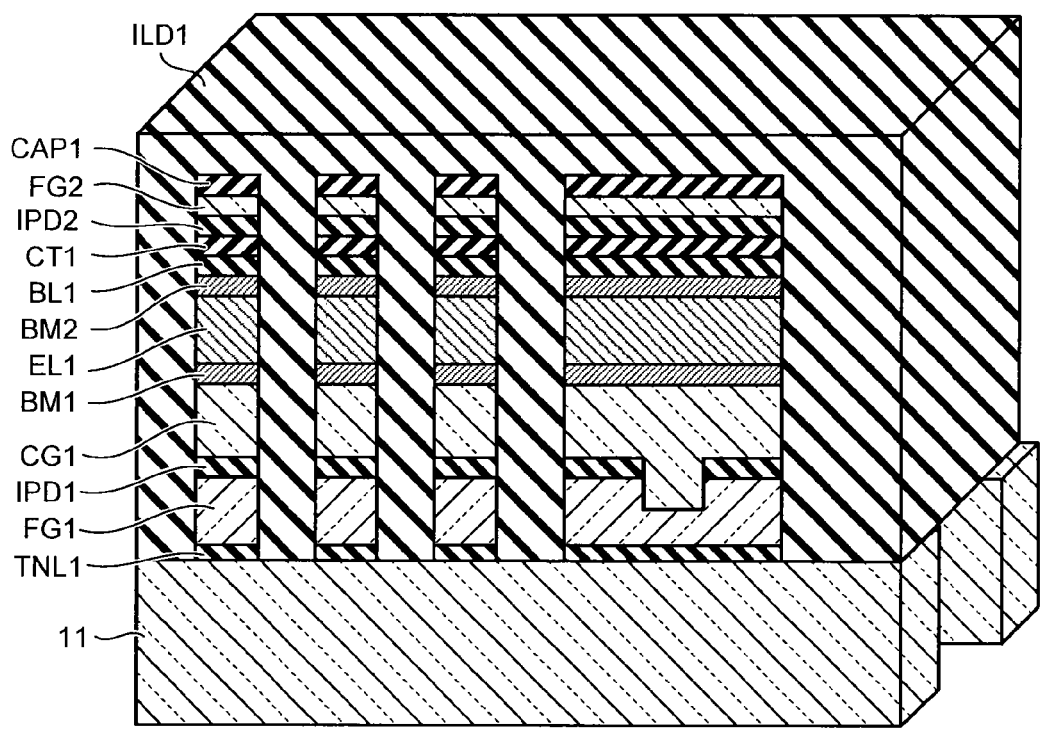
Figure 10B:
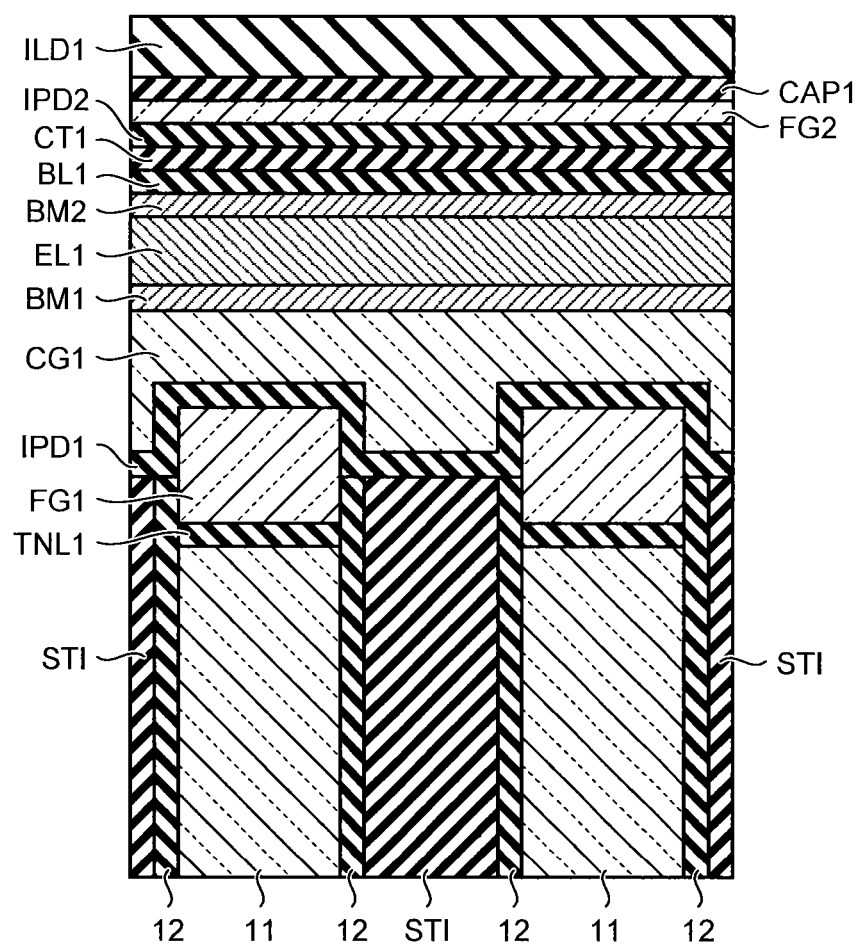

Next, as illustrated in FIG. 10A and FIG. 10B, the interlayer insulating film ILD1 is formed above the patterned semiconductor substrate 11. At this occasion, the interlayer insulating film ILD1 is formed so as to be higher than the upper surface of the cap film CAP1.

Figure 11A:
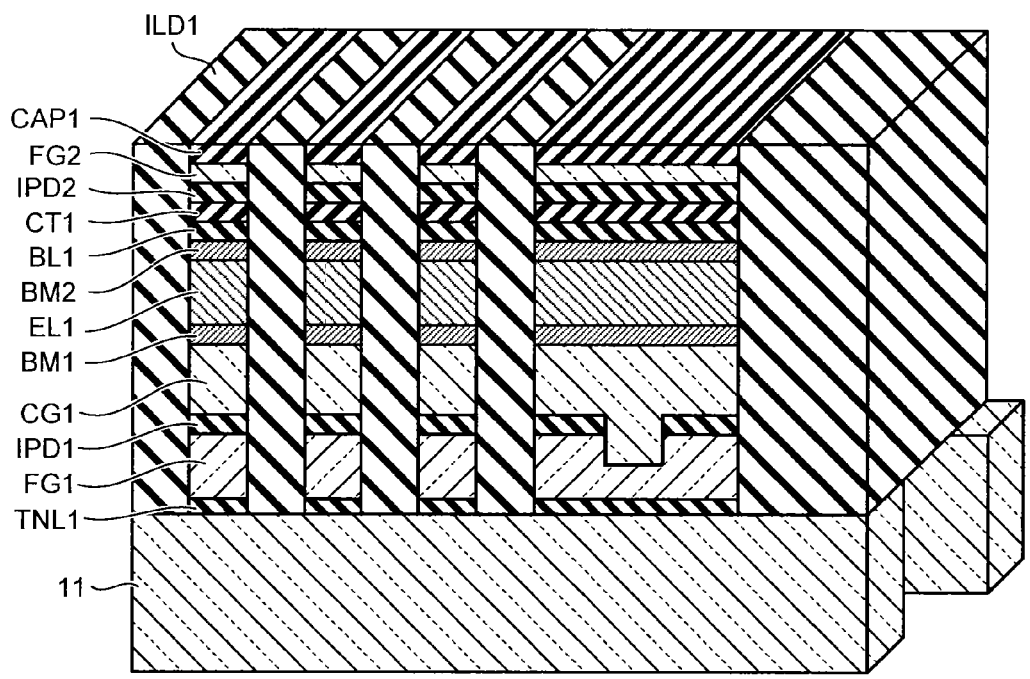
Figure 11B:
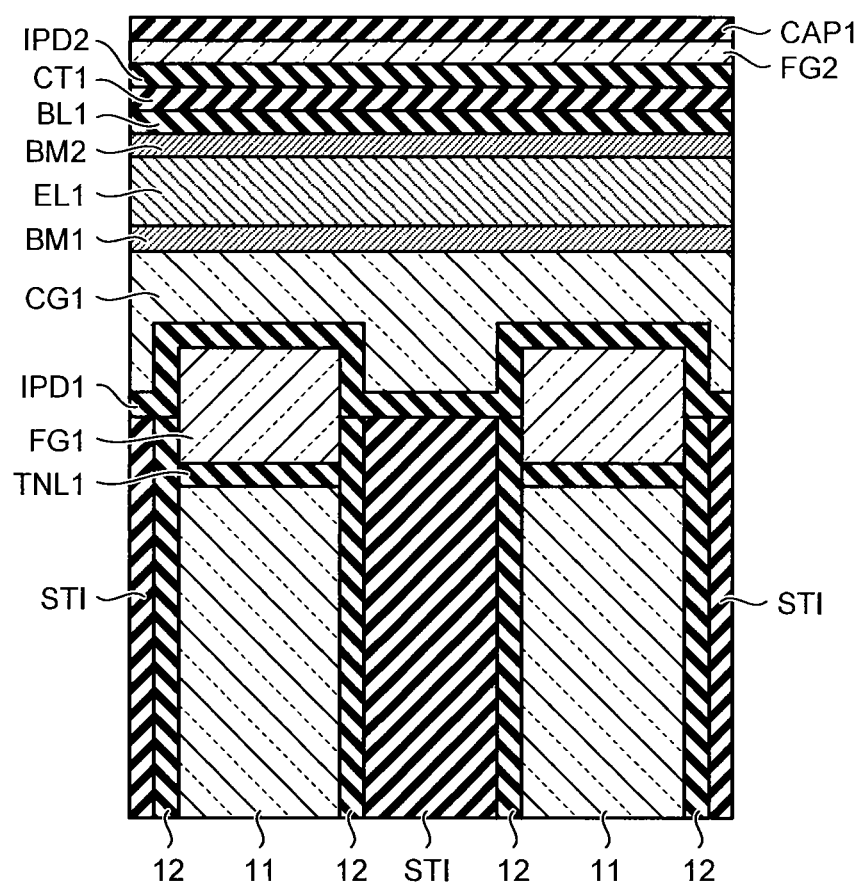

Next, as illustrated in FIG. 11A and FIG. 11B, the interlayer insulating film ILD1 formed above the upper surface of the cap film CAP1 is removed by using the cap film CAP1 as the stopper and using a CMP (Chemical Mechanical Polishing) method, and the upper surfaces are made flat.

Figure 12A:
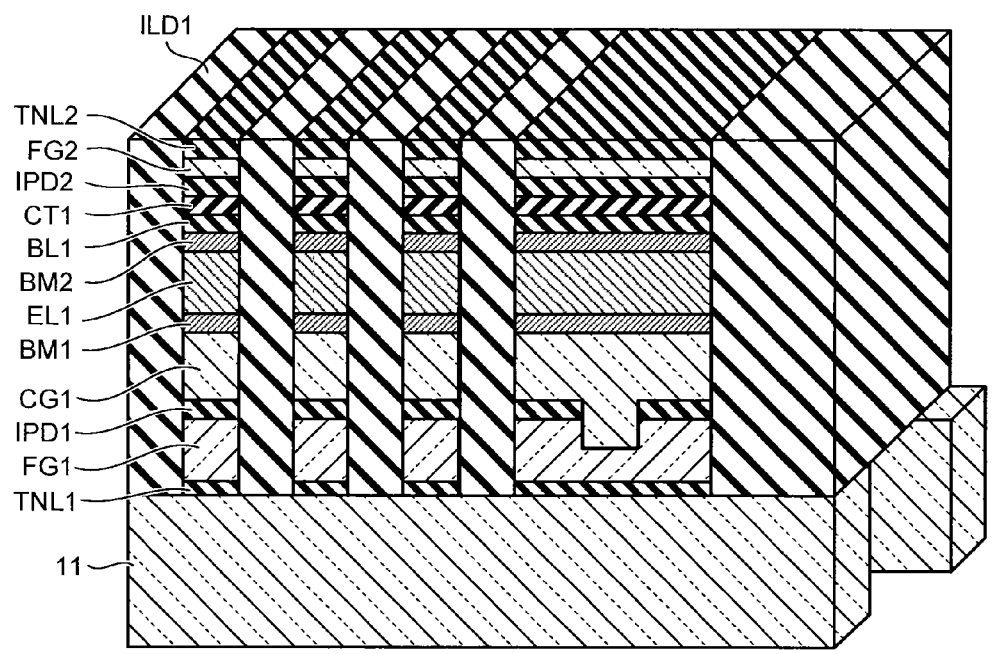
Figure 12B:
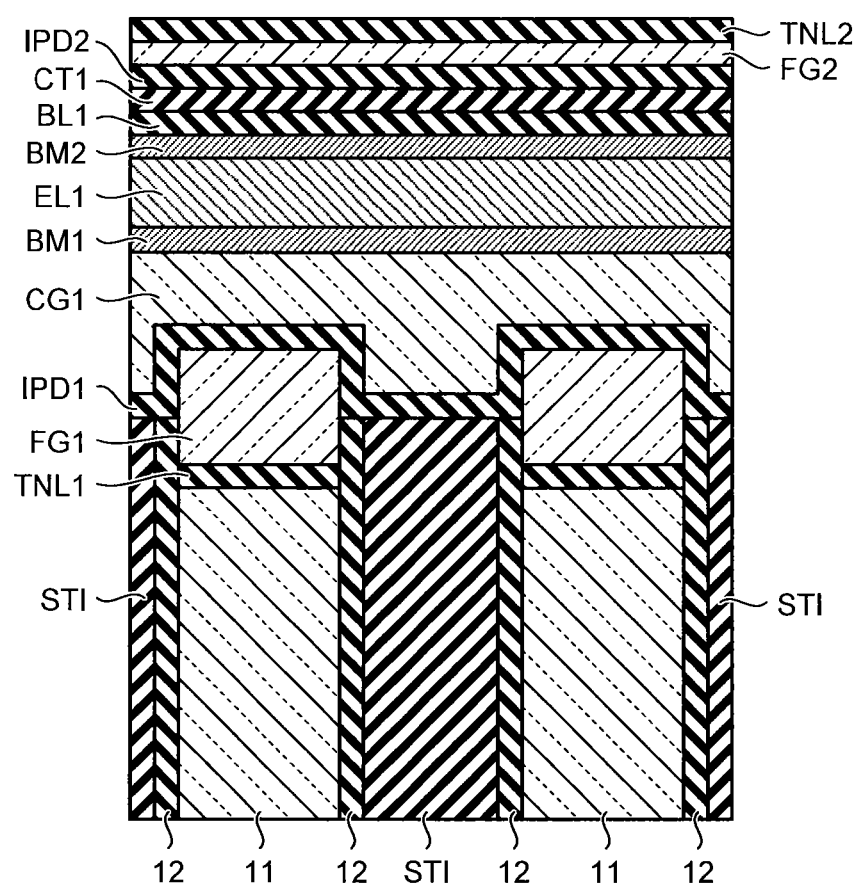

Thereafter, as illustrated in FIG. 12A and FIG. 12B, the cap film CAP1 is stripped, and the tunnel insulating films TNL2 are deposited on the floating gate electrode films FG2 that are exposed.

Figure 13A:
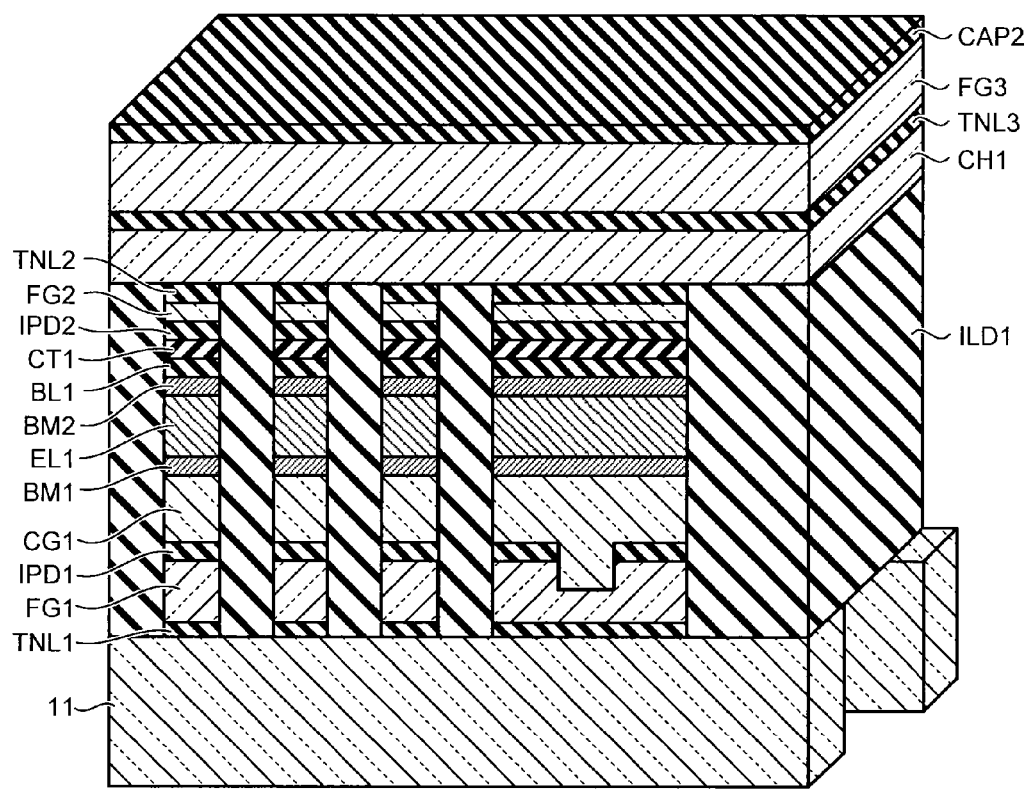
Figure 13B:
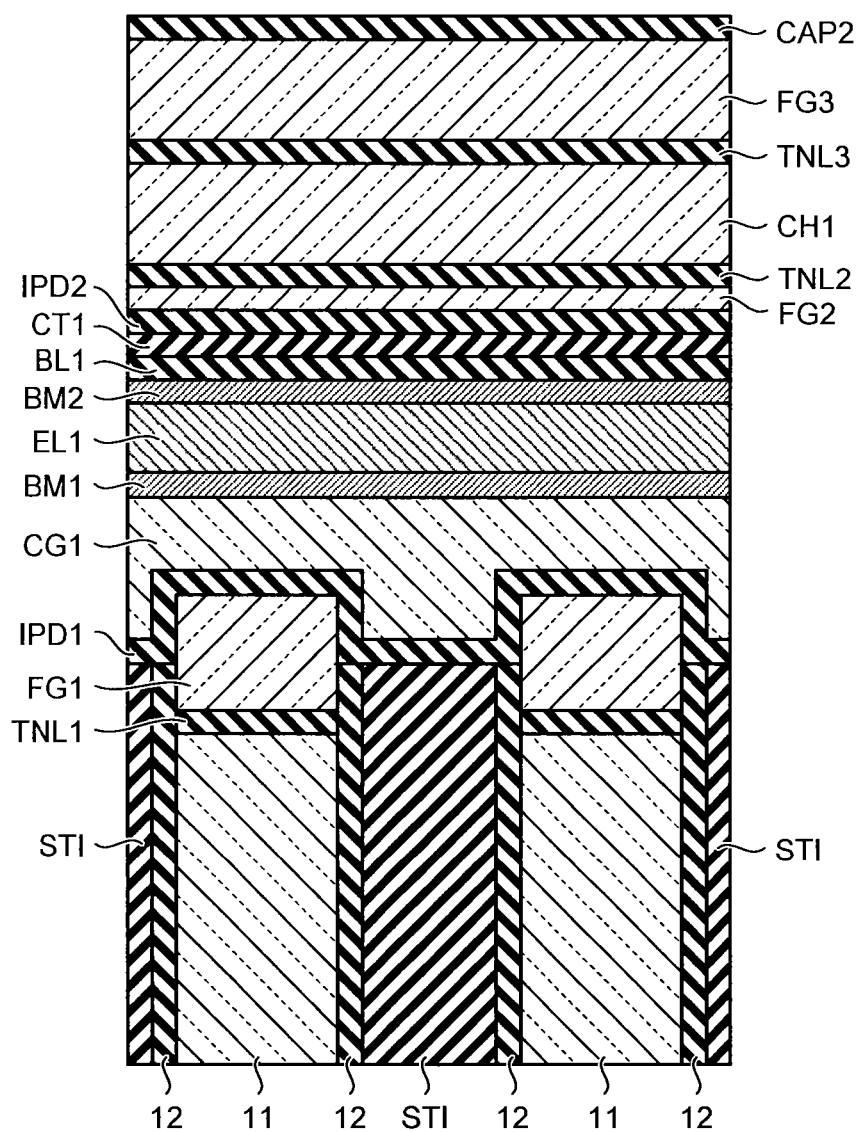

Next, as illustrated in FIG. 13A and FIG. 13B, the channel semiconductor film CH1, the tunnel insulating film TNL3, the floating gate electrode film FG3, and a cap film CAP2 are orderly stacked above the interlayer insulating film ILD1 and the tunnel insulating film TNL2. As the channel semiconductor film CH1, a polycrystalline silicon film of a predetermined conductivity type with the thickness of 50 to 200 nm may be used. Further, as the tunnel insulating film TNL1, for example, a silicon oxide film with the thickness of 8 nm may be used, and as the floating gate electrode film FG1, for example, a polycrystalline silicon film with the thickness of 60 nm may be used. As the cap film CAP2, a SiN film with the thickness of 10 to 30 nm and the like may be used.

Figure 14A:
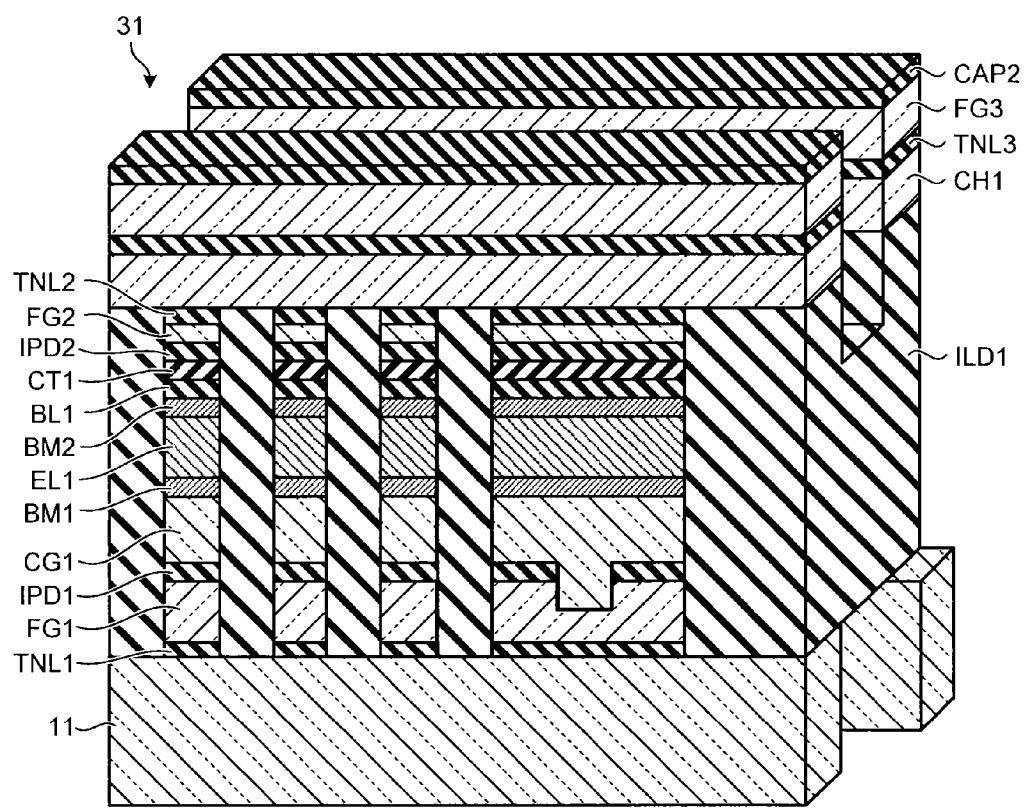
Figure 14B:
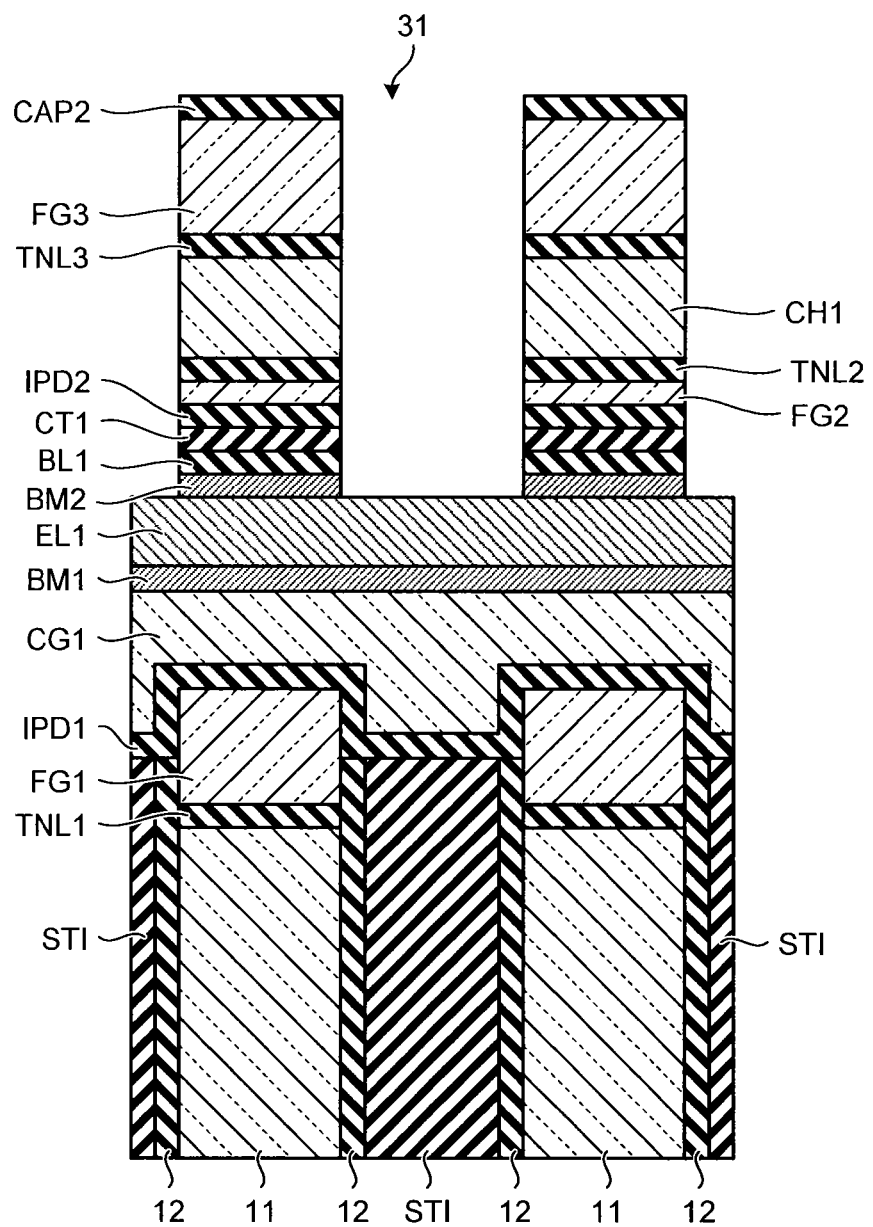

Thereafter, as illustrated in FIG. 14A and FIG. 14B, trenches 31 for element isolation insulating film formation that penetrate the channel semiconductor film CH1 from the cap film CAP2, have a depth reaching the barrier metal films BM2, and extend in the Y direction are formed at a predetermined interval in the X direction by using the lithography technique and the etching technique. At this occasion, the trenches 31 are stopped at the metal electrode films EL1. Further, the trench 31 for element isolation insulating film formation is formed to be aligned with the forming positions of the element isolation insulating films STI formed in the semiconductor substrate 11. According to this, active regions (channel semiconductor films CH1), the floating gate electrodes (block insulating film BL1, charge trapping film CT1, inter-electrode insulating film IPD2, and floating gate electrode film FG2 of the memory cell string of the second layer and the floating gate electrode film FG3 of the memory cell string of the third layer) of the memory cell string of the second layer and the memory cell string of the third layer are collectively processed.

Figure 15A:
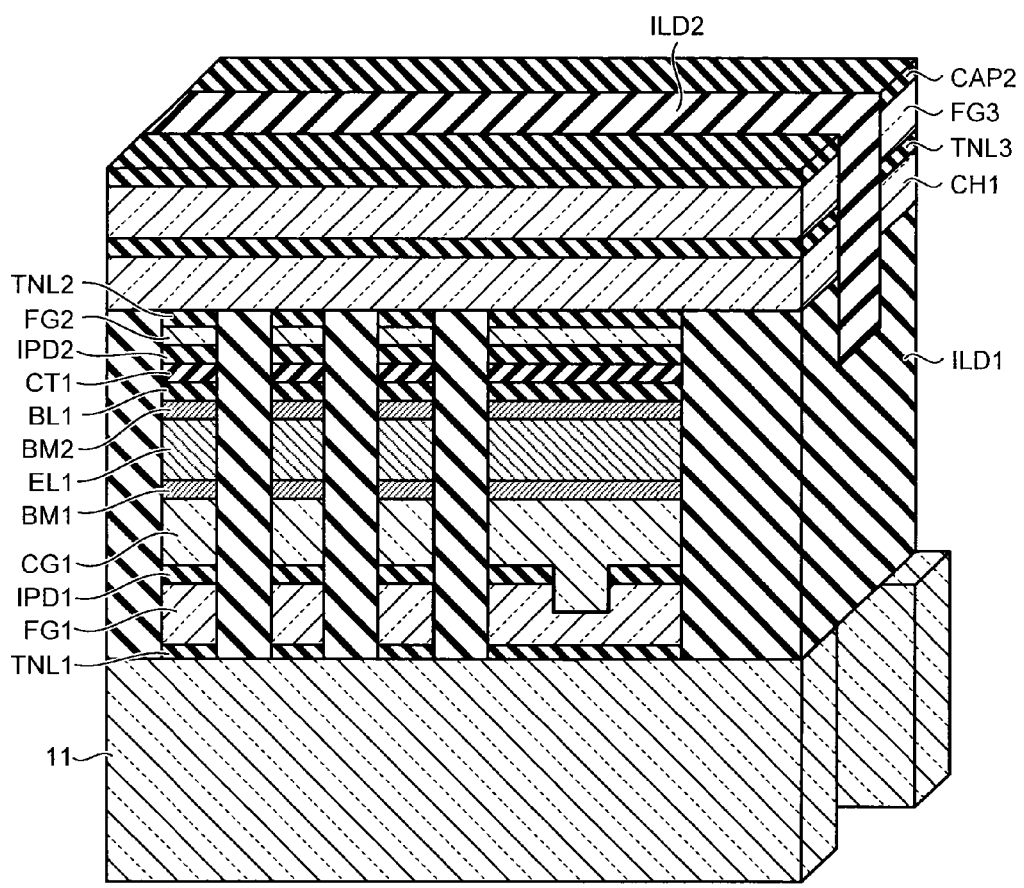
Figure 15B:
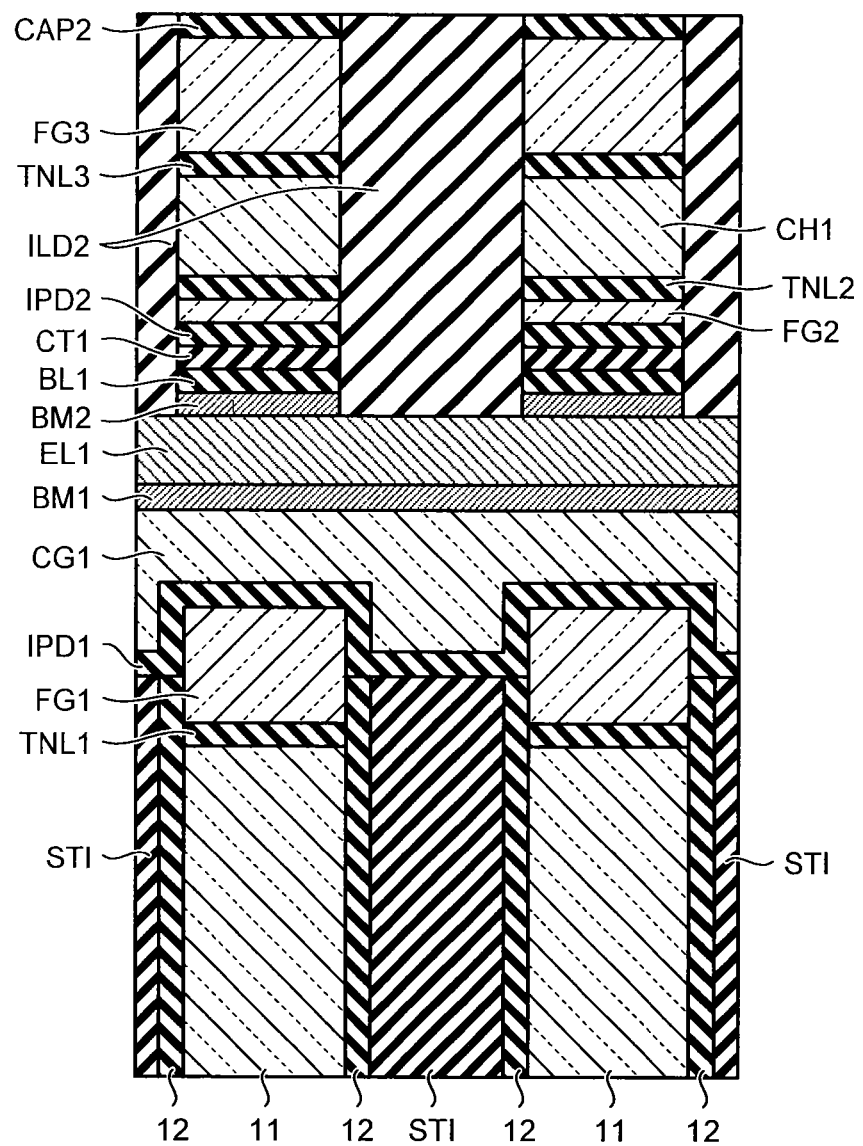

Next, as illustrated in FIG. 15A and FIG. 15B, the interlayer insulating film ILD2 such as a silicon oxide film is formed above the semiconductor substrate 11 so as to be embedded in the trench 31 for element isolation insulating film formation. Thereafter, the interlayer insulating film ILD2 formed above the cap film CAP2 is removed by a method such as a CMP method by using the cap film CAP2 as a stopper, and the upper surfaces are planarized. This interlayer insulating film ILD2 functions as the element isolation insulating film between the channel semiconductor films CH1.

Figure 16A:
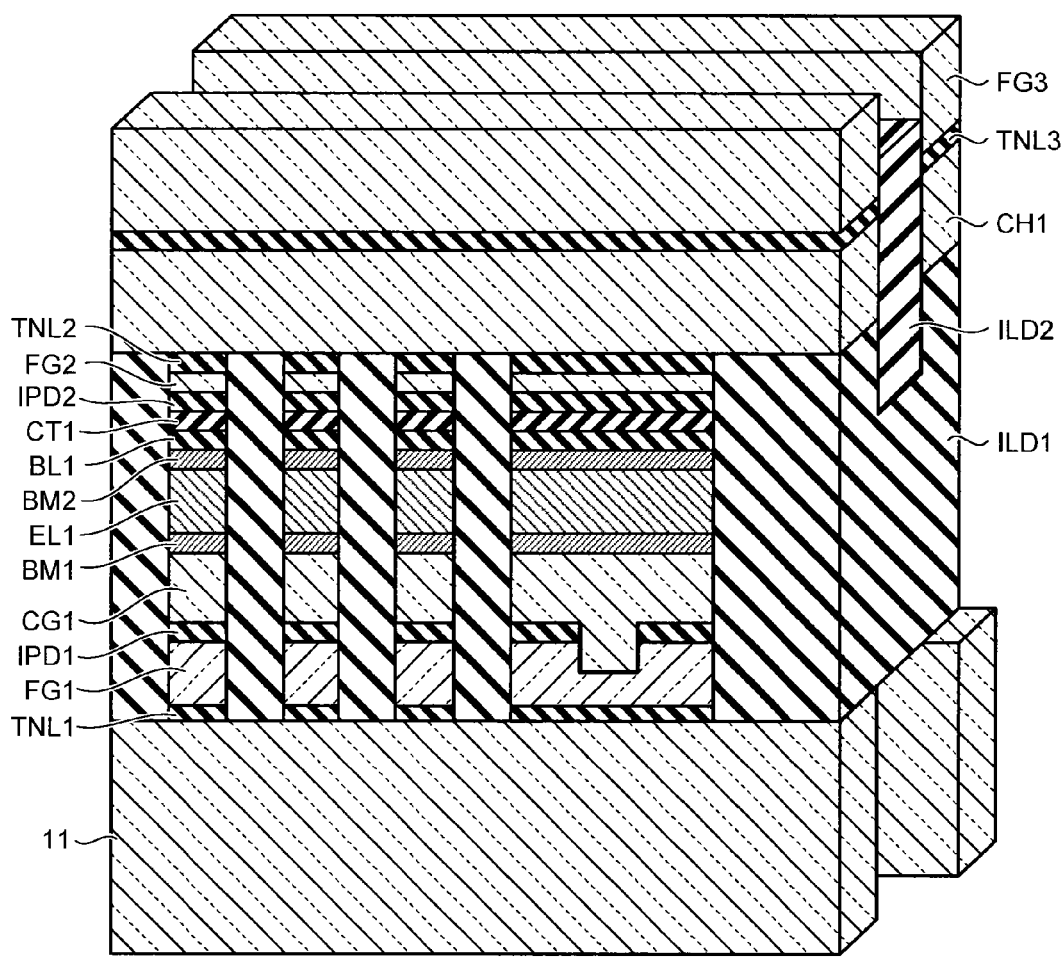
Figure 16B:
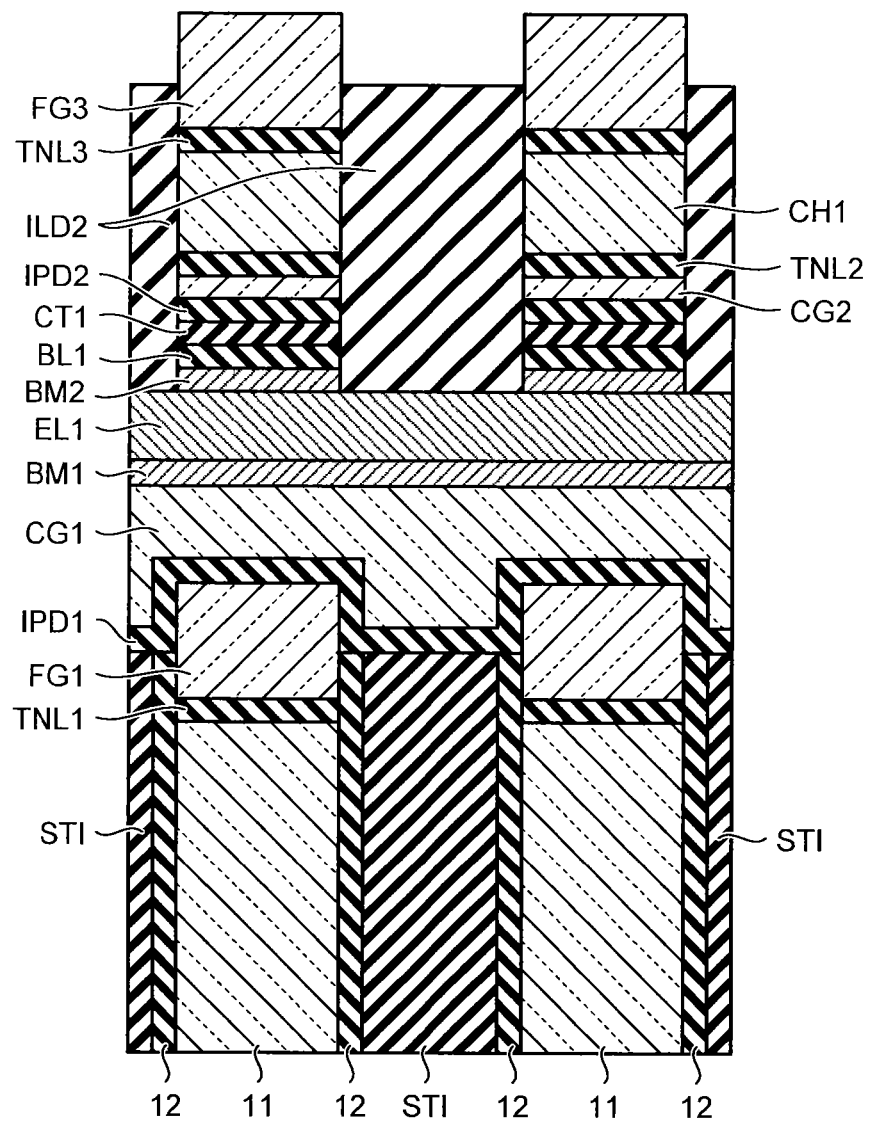

Thereafter, as illustrated in FIG. 16A and FIG. 16B, an upper surface of the interlayer insulating film ILD2 is etched back so that the upper surface of the interlayer insulating film ILD2 becomes higher than upper surfaces of the tunnel insulating films TNL3 and lower than upper surfaces of the floating gate electrode films FG3.

Figure 17A:
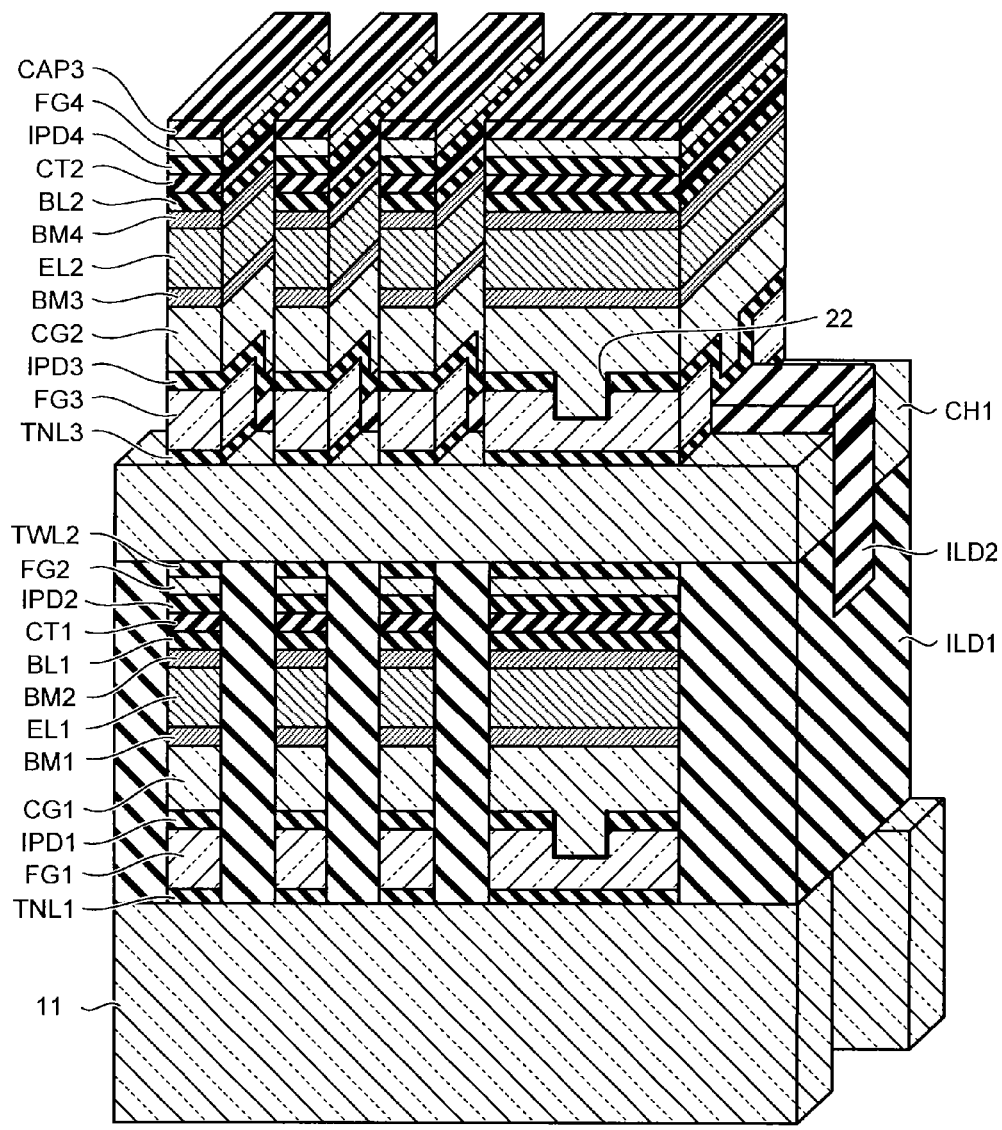
Figure 17B:
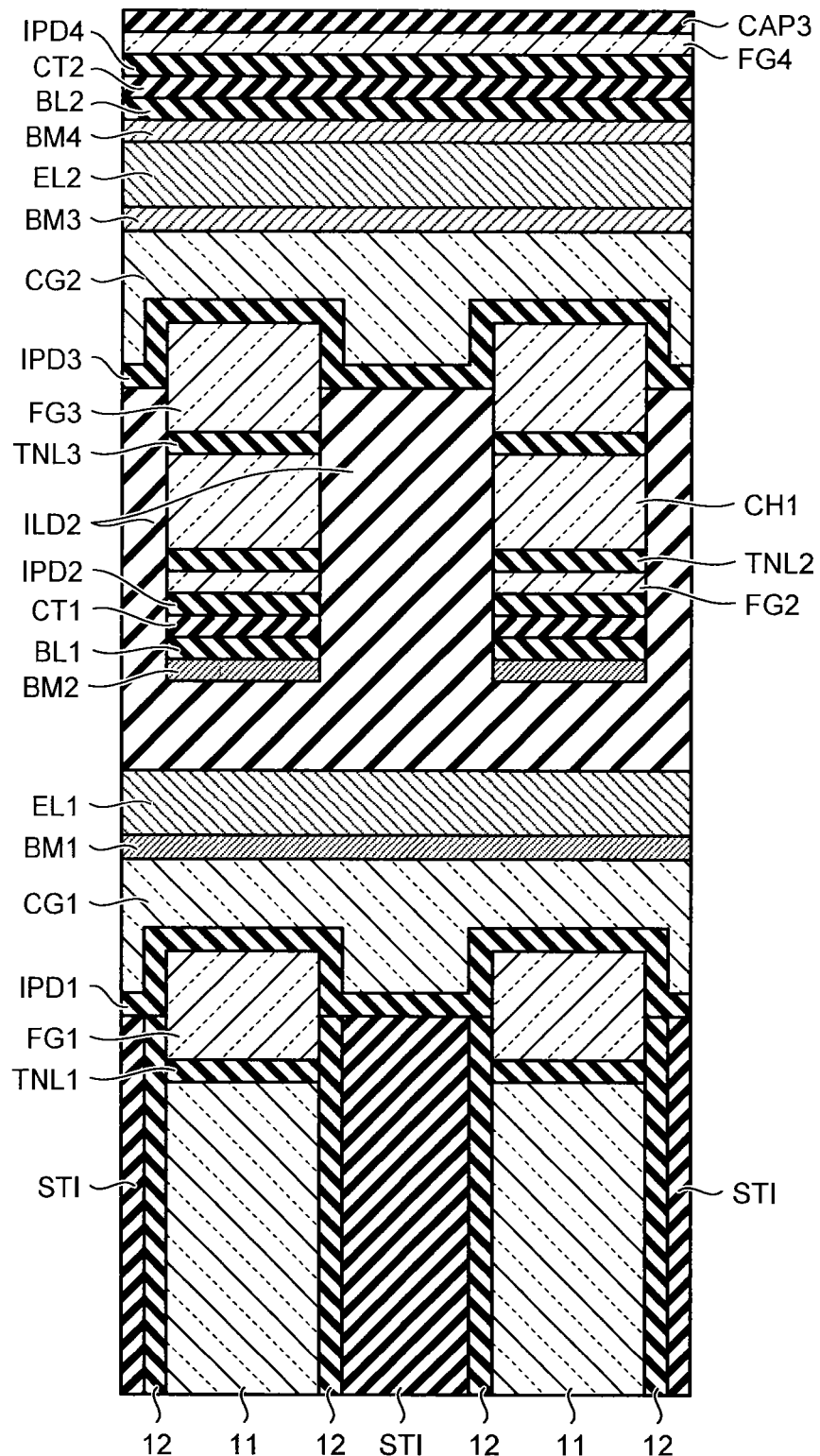

Next, as illustrated in FIG. 17A and FIG. 17B, the inter-electrode insulating film IPD3 is formed above the entire surface of the semiconductor substrate 11. At this occasion, the inter-electrode insulating film IPD3 is formed so that the upper surfaces of the interlayer insulating film ILD2, side surfaces and the upper surfaces of the floating gate electrode films FG3, thereof are covered conformally in the X direction. As the inter-electrode insulating film IPD3, for example, a silicon oxide film with the thickness of 10 nm and the like may be used.

Thereafter, a part of the inter-electrode insulating film IPD3 at a select gate transistor forming position is removed, and the opening 22 penetrating in the thickness direction of the inter-electrode insulating film IPD3 is provided. Then, the control gate electrode film CG2 is formed above the entire surface of the semiconductor substrate 11. As the control gate electrode film CG2, for example, a polycrystalline silicon film with the thickness of 20 nm may be used. According to this, at the select gate transistor forming position, the control gate electrode film CG2 makes contact with the floating gate electrode films FG3 through the opening 22.

Next, the barrier metal film BM3, the metal electrode film EL2, the barrier metal film BM4, the block insulating film BL2, the charge trapping film CT2, the inter-electrode insulating film IPD4, the floating gate electrode film FG4, and a cap film CAP3 are orderly stacked above the semiconductor substrate 11.

As the barrier metal films BM3, BM4, for example, tungsten nitride (WN) with the thickness of 5 nm and the like may be used, and as the metal electrode film EL2, for example, tungsten (W) with the thickness of 50 nm and the like may be used. Further, as the block insulating film BL2, for example, a $HfSiO_x$ film with the thickness of 7 nm and the like may be used, and as the charge trapping film CT2, a $HfSiO_x$ film with the thickness of 5 nm and the like may be used. As the inter-electrode insulating film IPD4, for example, a SiN film with the thickness of 3 nm and the like may be used, and as the floating gate electrode film FG4, for example, a polycrystalline silicon film with the thickness of 5 nm and the like may be used. Further, as the cap film CAP3, a SiN film with the thickness of 10 to 30 nm and the like may be used.

Thereafter, by using the lithography technique and the etching technique, in a memory cell transistor forming region, the cap film CAP3 to the tunnel insulating film TNL3 are processed in a line and space-shaped pattern that is extending in the X direction and arranged at a predetermined interval in the Y direction. And, in select gate transistor forming regions on both sides of the memory cell transistor forming region in the Y direction, a line pattern of the select gate transistor is thicker than a width of the memory cell transistor. According to this, the control gate electrodes (control gate electrode film CG2, barrier metal film BM3, metal electrode film EL2, barrier metal film BM4) of the memory cell strings of the third layer and the fourth layer are concurrently processed.

Next, as illustrated in FIG. 1 and FIG. 2, an interlayer insulating film that is not illustrated is formed above the patterned semiconductor substrate 11. At this occasion, the interlayer insulating film is formed so as to be higher than the upper surface of the cap film CAP3. Next, the interlayer insulating film formed above the upper surface of the cap film CAP3 is removed by using the cap film CAP3 as the stopper and using a CMP method, and the upper surfaces are planarized.

Thereafter, the cap film CAP3 is stripped, and the tunnel insulating films TNL4 are deposited on the floating gate electrode films FG4 that are exposed. Further, the channel semiconductor films CH2 are formed on the interlayer insulating films and the tunnel insulating films TNL4. As the channel semiconductor film CH2, a polycrystalline silicon film of a predetermined conductivity type with the thickness of 50 to 200 nm may be used.

Then, trenches for element isolation insulating film formation that has a depth reaching the barrier metal films BM4 from the semiconductor film CH2 and extend in the Y direction are formed at a predetermined interval in the X direction by using the lithography technique and the etching technique. At this occasion, the trenches are stopped at the metal electrode films EL2. Further, the trench for element isolation insulating film formation is formed to be aligned with the forming positions of the element isolation insulating films STI formed in the semiconductor substrate 11. According to this, an active region (channel semiconductor films CH2) and the floating gate electrode (block insulating film BL2, charge trapping film CT2, inter-electrode insulating film IPD4, and floating gate electrode film FG4 of the memory cell string of the fourth layer) of the memory cell string of the fourth layer are processed. According to the above, the nonvolatile semiconductor memory device illustrated in FIG. 1 and FIG. 2 is obtained.

Notably, a case in which four layers of memory cell strings are stacked is described herein, plural layers of memory cell strings can be stacked by the above method.

According to the first embodiment, by forming the memory cell string of the first layer with the rocket cell structure above the single-crystalline semiconductor substrate 11, and by forming the memory cell string of the second layer with the planar cell structure whose control gate electrode is shared with the memory cell string of the first layer, the memory cell string stacked body including the memory cell strings of the first and second layer is formed. Further, plural layers are stacked in the height direction in a manner with which the channel semiconductor film is shared by the memory cell string stacked body of the lower layer and the memory cell string staked body of the upper layer. According to this, it is possible to improve a reliability in the case of the nonvolatile semiconductor memory device by the first embodiment that includes the memory cell transistors of the rocket cell structure compared to a nonvolatile semiconductor memory device with a structure in which only the memory cell transistors of the planar cell structure are stacked.

Further, the processing of the control gate electrodes of the memory cell strings of the lower layer and the upper layer in the memory cell string stacked body is simultaneously performed, and the processing of the active regions (channel semiconductor films CH1, CH2) and the floating gate electrodes between the stacked memory cell string stacked bodies is simultaneously performed. Then, it is possible to reduce a number of lithography and etching processing used in the processing of the floating gate electrodes and the active regions on the second layer and thereafter to about half compared to a case of stacking simple planar cell structures.

Moreover, the processing of the active regions (channel semiconductor films CH1, CH2) and the floating gate electrodes between the stacked memory cell string stacked bodies is simultaneously performed. Then, it is possible to easily suppress an alignment error of the floating gate electrodes and the active regions (channel semiconductor films CH1, CH2).

Moreover, in the memory cell string stacked body, although the gate electrode of the select gate transistors SGT are shared in the upper layer and the lower layer, the select gate transistor SGT of the upper layer includes the charge trapping film. Then, the threshold voltage of the select gate transistor SGT of the upper layer can be controlled by the accumulated charge amount in the charge trapping film. It is possible to select only one of the select gate transistors SGT of the upper layer or the lower layer. Further, there is no need to provide the opening 21 in the select gate transistor SGT of the upper layer. As a result, the processes can be simplified.

Second Embodiment

Figure 18:
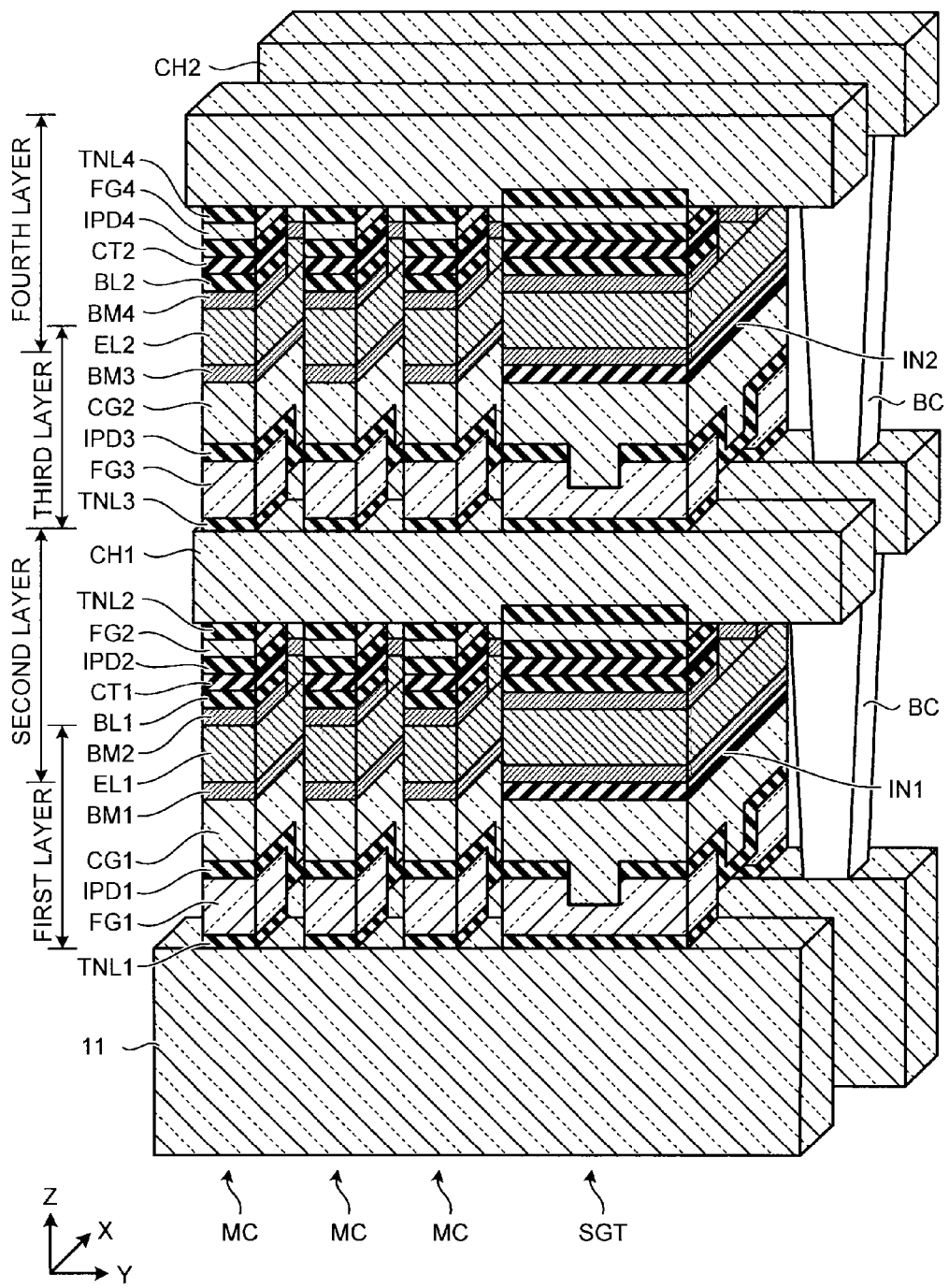
FIG. 18 is a perspective view schematically illustrating an example of a configuration of a nonvolatile semiconductor memory device of a second embodiment.
Figure 19:
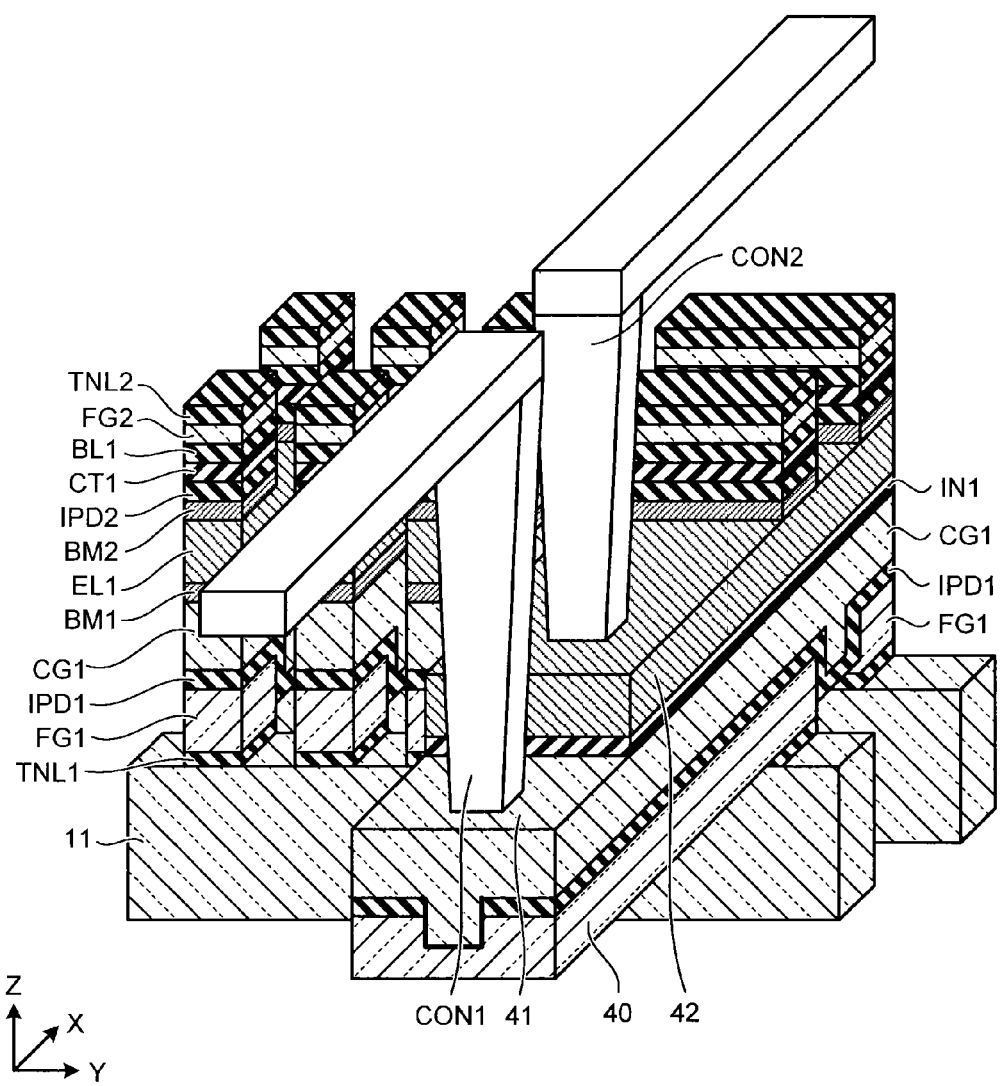
FIG. 19 is a perspective view schematically illustrating an example of a contact portion of a select gate line in the nonvolatile semiconductor memory device of the second embodiment.

FIG. 18 is a perspective view schematically illustrating an example of a nonvolatile semiconductor memory device of the second embodiment, and FIG. 19 is a perspective view schematically illustrating an example of a contact portion of a select gate line of the nonvolatile semiconductor memory device of the second embodiment. Notably, in FIG. 18, interlayer insulating films are omitted from the drawings. Further, in FIG. 18, a channel direction (bit line direction) is set as a Y direction, a height direction is set as a Z direction, and a direction vertical to both the Y direction and the Z direction is set as an X direction.

The nonvolatile semiconductor memory device has a structure in which insulating films IN1, IN2 are provided at boundaries of select gate transistors SGT of an upper layer and a lower layer in a memory cell string stacked body in the nonvolatile semiconductor memory device of the first embodiment. In the first embodiment, the select gate transistors SGT of the upper layer and the lower layer in a memory cell string stacked body had a structure that shares a gate electrode (for example, in a case of a first layer of the memory cell string stacked body, a control gate electrode film CG1, a barrier metal film BM1, a metal electrode film EL1, and a barrier metal film BM2). On the other hand, in the second embodiment, a gate electrode of the select gate transistor SGT of the lower layer is the control gate electrode film CG1, and a gate electrode of the select gate transistor SGT of the upper layer is the barrier metal film BM1, the metal electrode film EL1, and the barrier metal film BM2.

Further, the gate electrode of the select gate transistor SGT of the lower layer and the gate electrode of the select gate transistor SGT of the upper layer are not shared, as illustrated in FIG. 19, contacts are connected to each gate electrodes. In this example, a hook-up portion 40 is provided in a region in which the gate electrode (select gate line) is extended in the X direction from a forming position of the select gate transistor SGT. A hook-up portion 41 of the select gate transistor SGT of the lower layer is processed to be elongated in the X direction compared to a hook-up portion 42 of the select gate transistor SGT of the upper layer. That is, the hook-up portion 40 has a step-shaped structure.

Further, a contact CON1 that is connected to the select gate line to control the select gate transistor SGT of the lower layer is arranged at the hook-up portion 41 of the select gate transistor SGT of the lower layer. And a contact CON2 that is connected to the select gate line to control the select gate transistor SGT of the upper layer is arranged at the hook-up portion 42 of the select gate transistor SGT of the upper layer.

Notably, since other configurations are similar to those described in the first embodiment, descriptions thereof will be omitted.

Further, in a selection of a memory cell string in the nonvolatile semiconductor memory device with such a structure, since the independent select gate lines are selected, a threshold voltage of select gate transistors of the upper layer does not need to be controlled as in the first embodiment. Notably, although the select gate transistor SGT of the upper layer includes a charge accumulation layer, there will be no problem so long as an operation is performed at a voltage by which a threshold of the select gate transistor SGT of the upper layer does not change.

Figure 20:
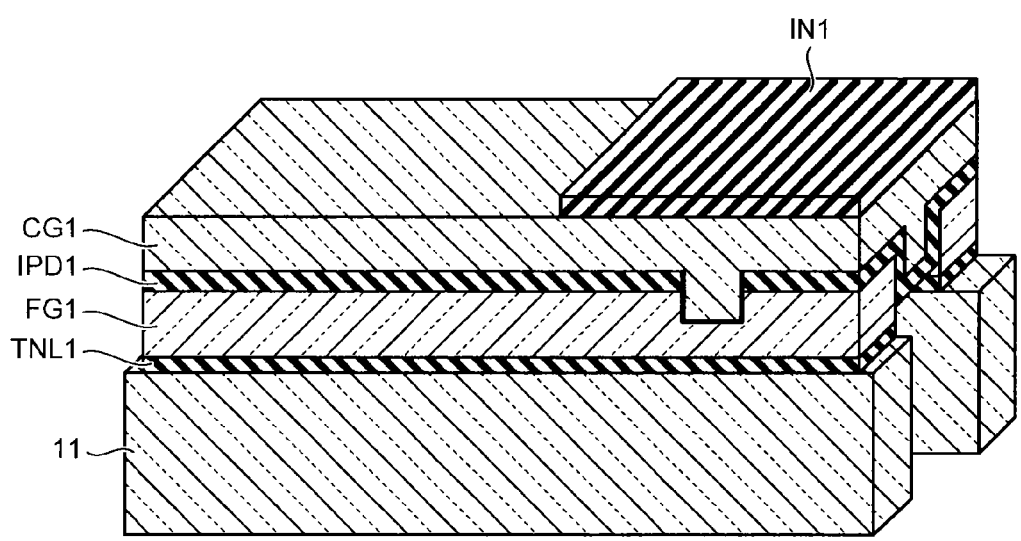
FIG. 20 and FIG. 21 are perspective views schematically illustrating an example of procedures of a method of manufacturing the nonvolatile semiconductor memory device of the second embodiment.
Figure 21:
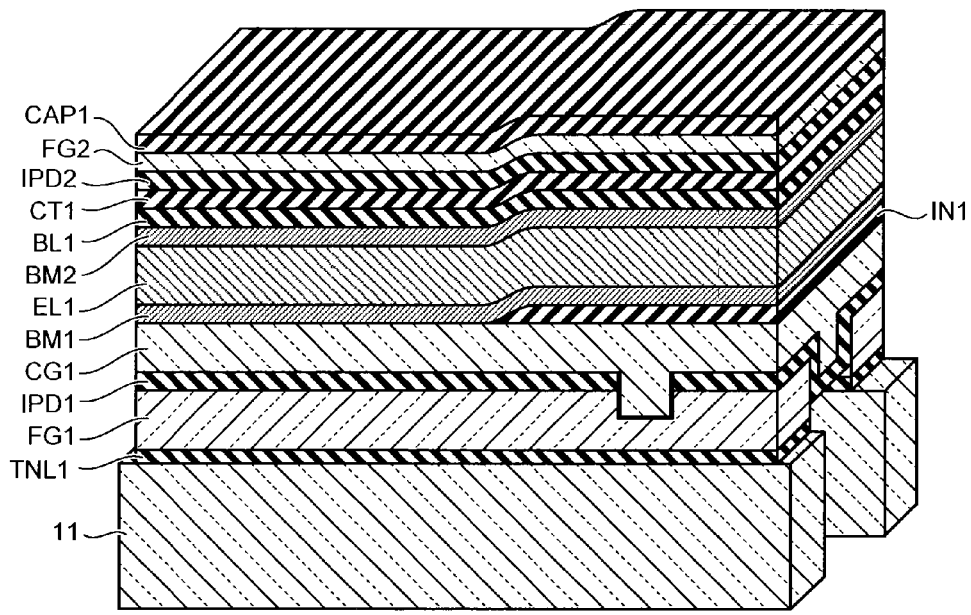

FIG. 20 and FIG. 21 are perspective views schematically illustrating an example of procedures of a method of manufacturing the nonvolatile semiconductor memory device of the second embodiment. As illustrated in FIG. 20, after FIG. 7A and FIG. 7B of the first embodiment, the insulating film IN1 is formed on the control gate electrode film CG1. Thereafter, etching is performed by using the lithography technique and the etching technique so that the insulating film IN1 remains only in a select gate transistor forming region (so as to selectively remove the insulating film IN1 in a memory cell forming region). According to this, the insulating film IN1 is formed in the select gate transistor forming region. Notably, as the insulating film IN1, for example, a silicon oxide film or a silicon nitride film with a thickness of 1 to 5 nm may be used. Further, even if silicon oxide films are used as the insulating films IN1, IN2, etching can be performed under a condition by which selectivity of etching rate between tungsten (W) used in the metal electrode films EL1, EL2 and the silicon oxide film ($SiO_2$) is almost equal. As a result, the insulating film IN1 and the metal electrode film EL1 (similarly, the insulating film IN2 and the metal electrode film EL2) can be etched simultaneously, whereby a number of steps does not increase.

Thereafter, as illustrated in FIG. 21, a barrier metal film BM1, a metal electrode film EL1, a barrier metal film BM2, a block insulating film BL1, a charge trapping film CT1, an inter-electrode insulating film IPD2, a floating gate electrode film FG2, and a cap film CAP1 are orderly stacked above the control gate electrode film CG1 and the insulating film IN1. Notably, since processes after the above are similar to those described in the first embodiment, descriptions thereof will be omitted. However, even after the formation of the memory cell string stacked body of the second layer, the process of forming the insulating film IN2 in the select gate transistor forming region on the control gate electrode film CG2 is performed.

Figure 23:
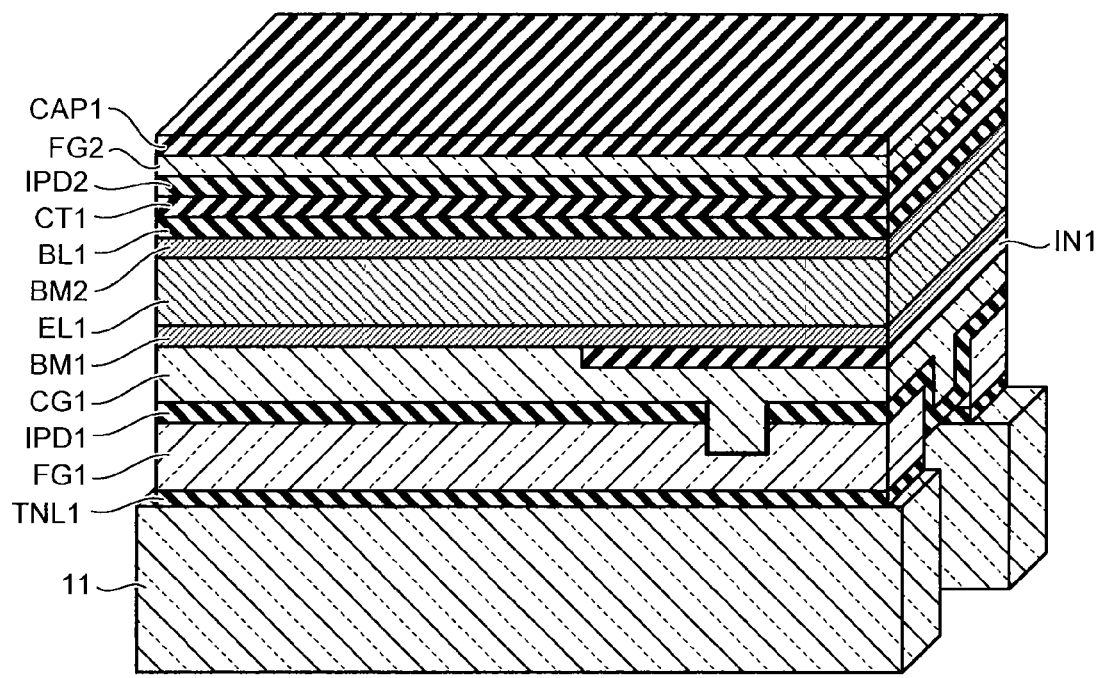
FIG. 23 is a perspective view schematically illustrating an example of alternative procedures of the method of manufacturing the nonvolatile semiconductor memory device of the second embodiment.

Further, FIG. 23 is a perspective view schematically illustrating an example of alternative procedures of the method of manufacturing the nonvolatile semiconductor memory device of the second embodiment. Instead of the step illustrated in FIG. 21, only the select gate transistor forming region is subjected to plasma oxidation or plasma nitridation. As a result, the insulating film IN1 can be formed without a step to the control gate electrode film G1. After the above, the nonvolatile semiconductor memory device of the second embodiment can be manufactured by the method of manufacturing similar to the above. As a result, processing margin in a post manufacturing step can be improved.

In the second embodiment, advantageous effects similar to the first embodiment can be achieved.

Third Embodiment

In the above described first and second embodiments, the channel of the memory cell string of the first layer is configured by a single-crystalline semiconductor substrate (for example, single-crystalline silicon substrate and the like), and further the memory cell transistors MC have the rocket cell structure, whereby the channel mobility is high compared to a memory cell string of the second and subsequent layers in which the channels are configured by polycrystal semiconductor layers (for example, polycrystalline silicon films and the like), and a satisfactory performance is exhibited thereby.

That is, the memory cell string at the lowermost layer has a fast write speed, but memory cell strings other than that have a slow write speed.

Figure 22A:
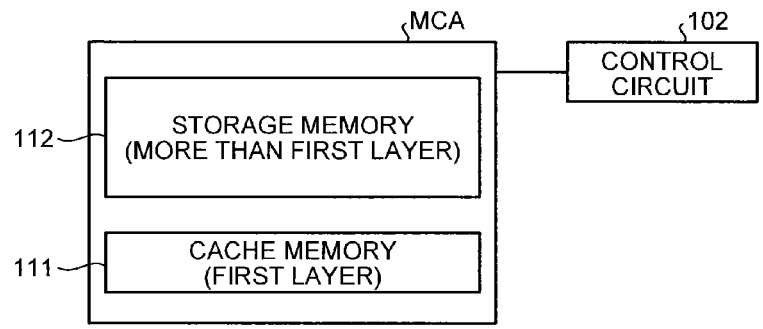
FIGS. 22A and 22B are block diagrams schematically illustrating an example of a configuration of a nonvolatile semiconductor memory device of a third embodiment.
Figure 22B:
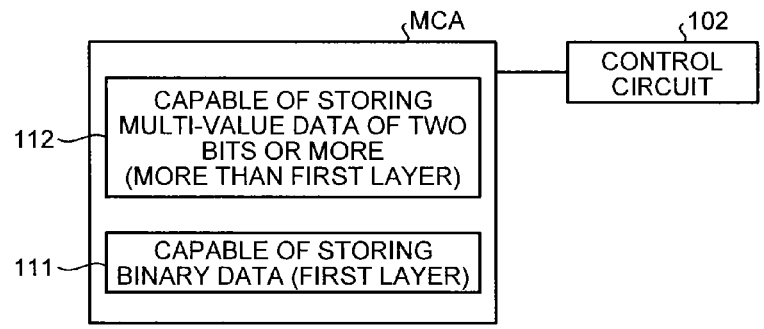

FIGS. 22A and 22B are block diagrams schematically illustrating an example of a configuration of a nonvolatile semiconductor memory device of a third embodiment. As illustrated in FIGS. 22A and 22B, the nonvolatile semiconductor memory device includes a memory cell array MCA in which the memory cell strings described above are arranged in a matrix shape, and a control circuit 102 configured to control a write operation to the memory cell array MCA.

The memory cell array MCA includes a cache memory 111 configured of the memory cell string of the lowermost layer (first layer) of the nonvolatile semiconductor memory device, and a storage memory 112 configured of memory cell strings other than the lowermost layer (first layer) that store user data in a storage memory in a long time (FIG. 22A).

Upon the write process, the control circuit 102 writes data to be written in the cache memory 111 first, and thereafter performs a process to write the same at a predetermined position in the storage memory 112.

One of other cases, all of the memory cell transistors MC may be configured capable of storing binary data, or only the memory cell transistors MC in the memory cell string of the lowermost layer may be configured capable of storing binary data and the memory cell transistors MC in the memory cell strings other than the above may be configured capable of storing multi-value data of two bits or more (FIG. 22B).

In the third embodiment, the memory cell string of the lowermost layer with the superior performance is used as the cache for data writing. According to this, it is possible to configure of including a cache memory and a storage memory that store user data like as by NAND type flash memory.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A nonvolatile semiconductor memory device comprising a first memory cell string stacked body including a first memory cell string having first memory cell transistors serially connected in a first direction above a semiconductor substrate, and a second memory cell string having second memory cell transistors serially connected in the first direction below a first channel semiconductor film, and one of the first memory cell transistors and one of the second memory cell transistors sharing with a first control gate electrode, wherein the first control gate electrode is formed so as to cover an upper surface of a first charge storage layer and at least a part of a side surface in a second direction intersecting the first direction via a first insulating film in the one of the first memory cell transistors, and the first control gate electrode is formed so as to cover only a lower surface of a second charge storage layer via a second insulating film in the one of the second memory cell transistors.

2. The nonvolatile semiconductor memory device according to claim 1, wherein the first memory cell string further includes a first select gate transistor arranged at one end of the first memory cell string, the second memory cell string further includes a second select gate transistor arranged at one end of the second memory cell string, and the second select gate transistors have an inverted structure of the first select gate transistors relative to a main surface of the semiconductor substrate.

3. The nonvolatile semiconductor memory device according to claim 2, wherein the first select gate transistors and the second select gate transistors share with the gate electrode.

4. The nonvolatile semiconductor memory device according to claim 2, wherein insulating films are arranged between gate electrodes of the first select gate transistors and the second select gate transistors.

5. The nonvolatile semiconductor memory device according to claim 3, further comprising a control circuit connected to the gate electrodes, wherein the control circuit is configured to adjust a first threshold voltage of the second select gate transistors so as to select either the first select gate transistors or the second select gate transistors.

6. The nonvolatile semiconductor memory device according to claim 5, wherein the second select gate transistors include an electrode being identical to the second memory cell transistors, and the control circuit is configured to control a voltage to be applied to the gate electrodes so as to be accumulated in a second charge storage layer of the second select gate transistors so that the first threshold voltage becomes higher than a second threshold voltage of the first select gate transistors, and so as to be discharged from the second charge storage layer so that the first threshold voltage becomes lower than the second threshold voltage.

7. The nonvolatile semiconductor memory device according to claim 6, wherein the control circuit is configured to control the first threshold voltage before an access to the one of the first memory cell transistors or the one of the second memory cell transistors, and control the voltage to be applied to the gate electrodes based on relationship of the first threshold voltage and the second threshold voltage and based on an access to the one of the first memory cell transistors or an access to the one of the second memory cell.

8. The nonvolatile semiconductor memory device according to claim 1, wherein the semiconductor substrate is configured of a single crystal, and the first channel semiconductor film is configured of polycrystal.

9. The nonvolatile semiconductor memory device according to claim 1, further comprising one or more second memory cell string stacked bodies including a third memory cell string having third memory cell transistors serially connected in the first direction above the first channel semiconductor film, and a fourth memory cell string having fourth memory cell transistors serially connected in the first direction below a second channel semiconductor film, and one of the third memory cell transistors and one of the fourth memory cell transistors sharing with a second control gate electrode, wherein the third memory cell transistors are formed so as to cover an upper surface and at least a part of a side surface in the second direction of a third charge storage layer via a third insulating film, and the fourth memory cell transistors formed so as to cover only a lower surface of a fourth charge storage layer via a fourth insulating film.

10. The nonvolatile semiconductor memory device according to claim 9, wherein the third memory cell string further includes a third select gate transistor arranged at one end of the third memory cell string, the fourth memory cell string further includes a fourth select gate transistor arranged at one end of the fourth memory cell string, and the fourth select gate transistors have an inverted structure of the third select gate transistors relative to a main surface of the semiconductor substrate.

11. The nonvolatile semiconductor memory device according to claim 10, wherein the third select gate transistors and the fourth select gate transistors share with the gate electrode.

12. The nonvolatile semiconductor memory device according to claim 10, wherein insulating films are arranged between gate electrodes of the third select gate transistors and the fourth select gate transistors.

13. The nonvolatile semiconductor memory device according to claim 9, wherein the semiconductor substrate is configured of a single crystal, and the first channel semiconductor film and the second channel semiconductor film are configured of polycrystal.

14. The nonvolatile semiconductor memory device according to claim 1, wherein the second memory cell strings are used as a storage memory, and the first memory cell string is used as a cache memory.

15. The nonvolatile semiconductor memory device according to claim 1, wherein the first memory cell string is configured to be capable of storing binary data, and the second memory cell strings is configured to be capable of storing multi-value data of two bits or more.

* * * * *